United States Patent [19]

Sablev et al.

[11] Patent Number: 5,503,725
[45] Date of Patent: Apr. 2, 1996

[54] METHOD AND DEVICE FOR TREATMENT OF PRODUCTS IN GAS-DISCHARGE PLASMA

[75] Inventors: Leonid P. Sablev; Anatoly A. Andreev, both of Kharkov, Ukraine; Sergei N. Crigoriev, Moscow; Alexandr S. Metel, Lenina, both of Russian Federation

[73] Assignee: Novatech, Moscow, Russian Federation

[21] Appl. No.: 146,043

[22] PCT Filed: Apr. 23, 1992

[86] PCT No.: PCT/RU92/00088

§ 371 Date: Dec. 13, 1993

§ 102(e) Date: Dec. 13, 1993

[87] PCT Pub. No.: WO92/19785

PCT Pub. Date: Nov. 12, 1992

[30] Foreign Application Priority Data

| Apr. 29, 1991 | [RU] | Russian Federation | 4938768 |
| Sep. 11, 1991 | [RU] | Russian Federation | 5002413 |
| Sep. 11, 1991 | [RU] | Russian Federation | 5002528 |
| Nov. 11, 1991 | [RU] | Russian Federation | 5008180 |
| Nov. 11, 1991 | [RU] | Russian Federation | 5008181 |
| Dec. 24, 1991 | [RU] | Russian Federation | 5018360 |
| Jan. 28, 1992 | [RU] | Russian Federation | 5024440 |
| Jan. 28, 1992 | [RU] | Russian Federation | 5024441 |
| Feb. 18, 1992 | [RU] | Russian Federation | 5027759 |

[51] Int. Cl.⁶ .......................... C23C 14/34; C23C 14/32
[52] U.S. Cl. ................... 204/192.12; 204/192.38; 204/298.41; 204/298.26; 118/723 VE; 427/540; 427/580; 219/121.11; 219/121.15; 219/121.36; 219/121.59; 250/426
[58] Field of Search .................... 204/192.1, 192.12, 204/192.15, 192.38, 298.41, 298.26; 118/723 R, 723 VE, 723 FE, 723 FI, 723 E, 723 ER; 148/230, 238, 316, 317; 427/540, 580; 250/426; 219/121.11, 121.15, 121.36, 121.59

[56] References Cited

U.S. PATENT DOCUMENTS

| 4,734,178 | 3/1988 | Gavrilov et al. | 204/192.38 |
| 4,762,756 | 8/1988 | Bergmann et al. | 204/192.12 |
| 4,929,321 | 5/1990 | Buhl | 204/192.38 |
| 4,992,153 | 2/1991 | Bergmann et al. | 204/192.12 |
| 5,192,578 | 3/1993 | Ramm et al. | 427/576 |
| 5,250,779 | 10/1993 | Kaufmann et al. | 204/298.41 |
| 5,294,322 | 3/1994 | Vetter et al. | 204/298.41 |

FOREIGN PATENT DOCUMENTS

| 63783 | 4/1983 | Finland . |
| 68783 | 7/1985 | Finland . |
| 3829260 | 3/1990 | Germany | 118/723 VE |

OTHER PUBLICATIONS

"Chemical Heat Treatment Of Materials", by Yu. Lakhtin, et al., 1985, Metallurgia Ph, Moscow, pp. 177–181.

Primary Examiner—R. Bruce Breneman
Assistant Examiner—Rodney G. McDonald
Attorney, Agent, or Firm—Knobbe, Martens, Olson & Bear

[57] ABSTRACT

A method for treatment of products in gas-discharge plasma consists in that a two-step vacuum-arc discharge is initiated between an anode (3) and an integrally cold cathode (2), featuring a metal-gaseous step of plasma and a gaseous step of plasma. The gaseous step of plasma is established by ionizing the working gas with electrons separated from the metal-gaseous step of plasma. Then a product (5) under treatment is preheated to working temperature and held in a preset temperature range. To this end, provision is made in the device for a means (13) for electron separation from the metal-gaseous step of plasma, which means is situated in the zone of the integrally cold cathode (2) and is impermeable to the metal ions generated by the cathode (2). In a particular case the means (13) is made as a set of V-shaped plates (14).

18 Claims, 14 Drawing Sheets

METHOD AND DEVICE FOR TREATMENT OF PRODUCTS IN GAS-DISCHARGE PLASMA

TECHNICAL FIELD

The present invention relates in general to methods and devices for hardening of tools and machine components and more specifically to methods and devices for treatment of products in gas-discharge plasma.

BACKGROUND ART

Known in the art is a method for treatment of products in gas-discharge plasma, said discharge being established in the working space between the anode and cathode under a reduced reaction gas pressure, comprising preheating of the product to working temperature and holding it at temperatures within a preset range (cf. "Chemical heat treatment of materials" by Yu. Lakhtin et al., 1985, Metallurgia PH, Moscow, pp. 177–181 (in Russian).

In the method mentioned above gas-discharge plasma is built up with the aid of a glow discharge at a partial pressure of the reaction gas in the range of 10 to 1000 Pa. Used as the reaction gas most commonly is nitrogen, therefore the method is called ionic nitriding. The process of ionic nitriding involves initiation of an anomalous glow discharge between the product (cathode and the anode, the interelectrode voltage being from 400 to 1000 V. Virtually the entire potential drop in a glow discharge is concentrated at the cathode in the region of cathode potential drop. The ions of the reaction gas (nitrogen) are accelerated in the region of cathode potential drop so as to bombard the surface of the product under treatment, thus heating said surface and simultaneously diffusing depthward to form a hardened superficial layer.

However, bombardment of the surface of the product under treatment with high-energy ions of the reaction gas carried out during ionchemical treatment results in the so-called cathode sputtering of the surface of the product being treated and hence in deterioration of the initial quality of surface finish.

Inasmuch as the process is conducted at a relatively high voltage (400–1000 V) applied to the product being treated, glow discharge is likely to turn into arc discharge (which is most possible to occur at the initial stages of the process). Cathode spots of arc discharge cause erosion of the surface of the product being treated in still higher degree than cathode sputtering. Arcing is reduced by gradual conducting of the process (that is, by reducing the discharge current and voltage). This measure, however, affects throughput capacity. A device for carrying said method into effect and aimed at treatment of products in gas-discharge plasma is known to comprise a direct current source electrically connected to the cathode and anode (cf. "Chemical heat treatment of materials" by Yu. M. Lakhtin et al., 1985, Metallurgia PH, Moscow, pp. 177–181 (in Russian).

Used as the anode in said device is a chamber in which the product being treated is placed, while the cathode is said product itself.

The direct current source enables the voltage to be infinitely adjusted within 1000 V.

The working chamber communicates with a pump to build up vacuum and with the source of the reaction gas which establishes a pressure of 10 to 1000 Pa in the chamber.

Once a voltage has been applied to the electrodes, i.e., the cathode and anode, a glow discharge is initiated in the chamber, whereby the product (cathode) is subjected to bombardment with the ions of the reaction gas. As a result, the product is heated and its surface is saturated with the ions of the reaction gas, thus hardening the surface layer of the product. However, ion bombardment sputters away the surface layer and hence deteriorates the initial quality of surface finish.

One more state-of-the-art method for treatment of products in the plasma of a gas-discharge established between the anode and cathode at a reduced reaction gas pressure is known to comprise preheating of the product to working temperature and holding it at temperatures within a preset range (FI, A, 63, 783).

According to said method, gas-discharge plasma is established with the use of a glow discharge.

The method comprises preheating of the product (cathode) placed in the working chamber (anode) containing the reaction gas (a nitrogen-oxygen mixture) to 400°–580° C., followed by holding the product at said temperature. In view of intensifying the preheating process and increasing the microhardness of the diffusion layer, chemical heat treatment is carried out at a pressure from 0.13 to 13.0 Pa, and the glow discharge is intensified by electrons accelerated to 200 eV.

Since said method is carried out in glow-discharge plasma and the product being treated serves as the cathode, its surface subjected to ion bombardment is sputtered away which affects adversely the initial quality of surface finish.

Still more method for treatment of products in gas-discharge plasma is known to comprise initiation of a vacuum-arc discharge between the anode and the integrally cold cathode, a vacuum-plasma treatment of the product by heating it to working temperature and holding the product in a preset temperature range in the medium of the reaction gas (U.S. Pat. No. 4,734,178).

According to said method, gas-discharge plasma is built up with the use of a more powerful (compared with glow discharge) vacuum-arc discharge involving an integrally cold cathode. A peculiar feature of this method resides in that the product under treatment heated by being bombarded with metal ions. However, treatment of heavy-weight products involves a prolonged heating time which is enough for the product surface is sputtered away, thus deteriorating the initial quality of surface finish.

Moreover, it is due to a low efficiency of the heating procedure that only a relatively low-weight product can be treated, this being on account of a discordance between the time of an optimum radiation dose and the heating time in case of treating heavy-weight products, which narrows the process capabilities of the method as a whole.

A device for treatment of products in gas-discharge plasma is known to carry out the method discussed before, said device comprising: a source of direct current electrically connected to an integrally cold cathode and to an anode, both being enclosed in a vacuum chamber containing the reaction gas at a reduced pressure (U.S. Pat. No. 4,734,178).

In the device mentioned above the product under treatment is heated by metal ions generated by the cathode, which results in sputtering away the surface of the product and hence in a deteriorated initial quality of surface finish.

In addition, said device cannot be used for all-over treatment of products, nor can it perform efficient treatment of dielectric products, which to a great extent restricts its technological capacities.

DISCLOSURE OF THE INVENTION

The present invention has for its principal object to provide a method for treatment of products in gas-discharge plasma, according to which such a vacuum-arc discharge is initiated that makes it possible to retain the initial quality of surface finish of the product being treated and to extend the process capabilities, as well as to provide a device for treatment of products in gas-discharge plasma, which carries said method into effect and wherein provision is made for such a means that makes it possible to extend the process capabilities of the device and to preserve the initial quality of surface finish of said product.

The foregoing object is accomplished due to the fact that in a method for treatment of products in gas-discharge plasma, comprising initiation of a vacuum-arc discharge between the anode and the integrally cold cathode a vacuum-plasma treatment of the product by preheating it to working temperature and holding the product in a preset temperature range in the medium of a working gas, according to the invention, a two-stage vacuum-arc discharge is initiated between the anode and the integrally cold cathode, said discharge featuring a metal-gaseous step of plasma and a gaseous step of plasma, i.e., the gaseous discharge, both of said steps being isolated from each other, while the latter step is established by ionizing the working gas with electrons separated from the metal-gaseous step of plasma of said vacuum-arc discharge.

The plasma of the vacuum-arc discharge can be generated at reduced working gas pressure in the range of $10^{-2}$ to 10 Pa.

It is advisable that the vacuum-plasma treatment of the product by exposing it to the main preheating to working temperature and holding in a preset temperature range be effected at the gaseous step of the vacuum arc discharge plasma.

It is expedient that the product under treatment, while being subjected to the main preheating, be additionally treated with a directional accelerated beam.

It is quite reasonable that nitrogen be used as the working gas.

It is favorable that the main heating of the product under treatment to working temperature be carried out by applying a positive potential to said product.

The main heating of the product under treatment to working temperature may also be effected by applying a negative potential to said product.

The main heating of the product being treated to working temperature may also be carried out with a floating potential applied to the product under treatment and initiated by the plasma of the gaseous step of the vacuum-arc discharge.

It is desirable to use a directional beam of neutral particles as the directional accelerated beam.

It is appropriate that the product under treatment be held in a preset temperature range by applying a positive potential to said product.

It is advantageous that a positive potential be stepwise applied to the product under treatment.

It is quite reasonable that the product under treatment be held in a preset temperature range by applying a negative potential thereto.

It is convenient that the product under treatment be held in a preset temperature range under a floating potential applied thereto and that said potential be initiated by the plasma of the gaseous step of the vacuum-arc discharge.

It is practicable to remove the negative potential from the product under treatment and to aleenergize the gaseous step of the vacuum-arc discharge plasma as soon as arc-discharge breakdowns occur on the product.

It is effective that the holding of the product under treatment in a preset temperature range at the gaseous step of the vacuum-arc discharge plasma be followed by applying a coating to the surface of said product.

It is convenient that a magnetic field be built up concurrently with application of a coating to the surface of the product under treatment at the gaseous step of the vacuum-arc discharge plasma, the lines of force of said magnetic field being arranged in planes square with the direction of the vacuum-arc discharge current.

The object of the invention is accomplished also due to the fact that in a device for treatment of products in gas-discharge plasma for carrying the aforementioned method into effect and comprising a source of direct current electrically connected to an integrally cold cathode and to a main anode, both being enclosed in a vacuum chamber in a medium of the working gas at a reduced pressure, according to the invention, provision is made for a means aimed at separation of electrons from the metal-gaseous step of the vacuum-arc discharge plasma, said means being situated in the zone of the integrally cold cathode and being impermeable to metal ions generated by the integrally cold cathode.

Used as the main anode can be the product under treatment itself.

It is expedient that the device be provided with an additional anode so positioned with respect to the integrally cold cathode and the means for separation of electrons as to enable the product under treatment to be arranged between the cathode, the means for electron separation, and the additional anode, and with a two-way switch connected to both anodes and to the source of direct current.

It is desirable that the means for separation of electrons be shaped as a set of V-form plates facing with one of their side surfaces toward the integrally cold cathode, and with the other side surface, toward the main anode.

The V-form plates of the means for electron separation can be set in reciprocating motion with respect to the walls of the vacuum chamber.

It is appropriate that the means for electron separation be shaped as louverboards.

The means for electron separation may be shaped as an iris diaphragm whose leaves are spaced apart in the zone of overlapping along the longitudinal axis of the vacuum chamber.

It is favorable that the means for electron separation be made as an L-shaped branch having one of its ends facing toward the main anode, while the integrally cold cathode be located in close proximity to the opposite nozzle end.

It is quite effective that the means for electron separation be in fact the vacuum chamber wall situated in the zone of the integrally cold cathode which is so positioned that its working area faces toward said wall.

The means for electron separation may be shaped as a disk arranged in a spaced position with respect to the walls of the vacuum chamber.

It is practicable that the integrally cold cathode be so positioned that its working area be angularly movable through 180° with respect to the vacuum chamber wall which serves as the means for electron separation.

It is worthwhile that the additional anode be shaped as a hollow cylinder one of whose ends faces towards the integrally cold cathode and the interior thereof accommodates the product being treated and that provision be made for a solenoid encompassing the additional anode, and a disk having a center hole and arranged coaxially with the additional anode between the means for electron separation and the end of the additional anode in close proximity to both said means and said anode.

It is convenient that provision be made in the present device for a sputtering target having a center hole and connected to the negative pole of an individual source of direct current, said target being interposed between the means for electron separation and the additional anode.

The sputtering target may be arranged coaxially with the additional anode.

It is advantageous that the sputtering target be shaped as a disk having a center hole.

It is preferable that the additional anode be ring-shaped and the cross-sectional area of said ring-shaped anode be equal to, or in excess of the cross-sectional area of the interior of the center hole in the sputtering target.

The sputtering target may also be shaped as a hollow cylinder whose interior is in fact the center hole of the sputtering target.

It is advisable that the sputtering target be shaped as a set of arcuate plates insulated from one another and arranged circumferentially so as to form the center hole of the sputtering target.

Such a realization of the proposed method and such a construction arrangement of the device carrying said method into effect, according to the invention, enable treatment of products to be performed without affecting the initial quality of surface finish which in turn makes it possible to render the heating process and the holding of the product in a preset temperature range the final operation preceding application of a coating to the surface thus treated without subsequent grinding and polishing operations, as well as to apply a coating to the surface of the product in a continuous technological process in the same vacuum chamber, which extends considerably the process capabilities of the method and device proposed herein.

In addition, the device, according to the invention for carrying the proposed method into effect adds to the throughput capacity of the proposed method of treatment due to a possibility of heating heavy-weight products, long-size ones inclusive, as well as provides for an efficient treatment of dielectric products.

BRIEF DESCRIPTION OF THE DRAWINGS

In what follows the invention is illustrated by a detailed description of specific exemplary embodiments thereof with reference to the accompanying drawings, wherein.

BEST WAYS OF CARRYING OUT THE INVENTION

Figure 1:
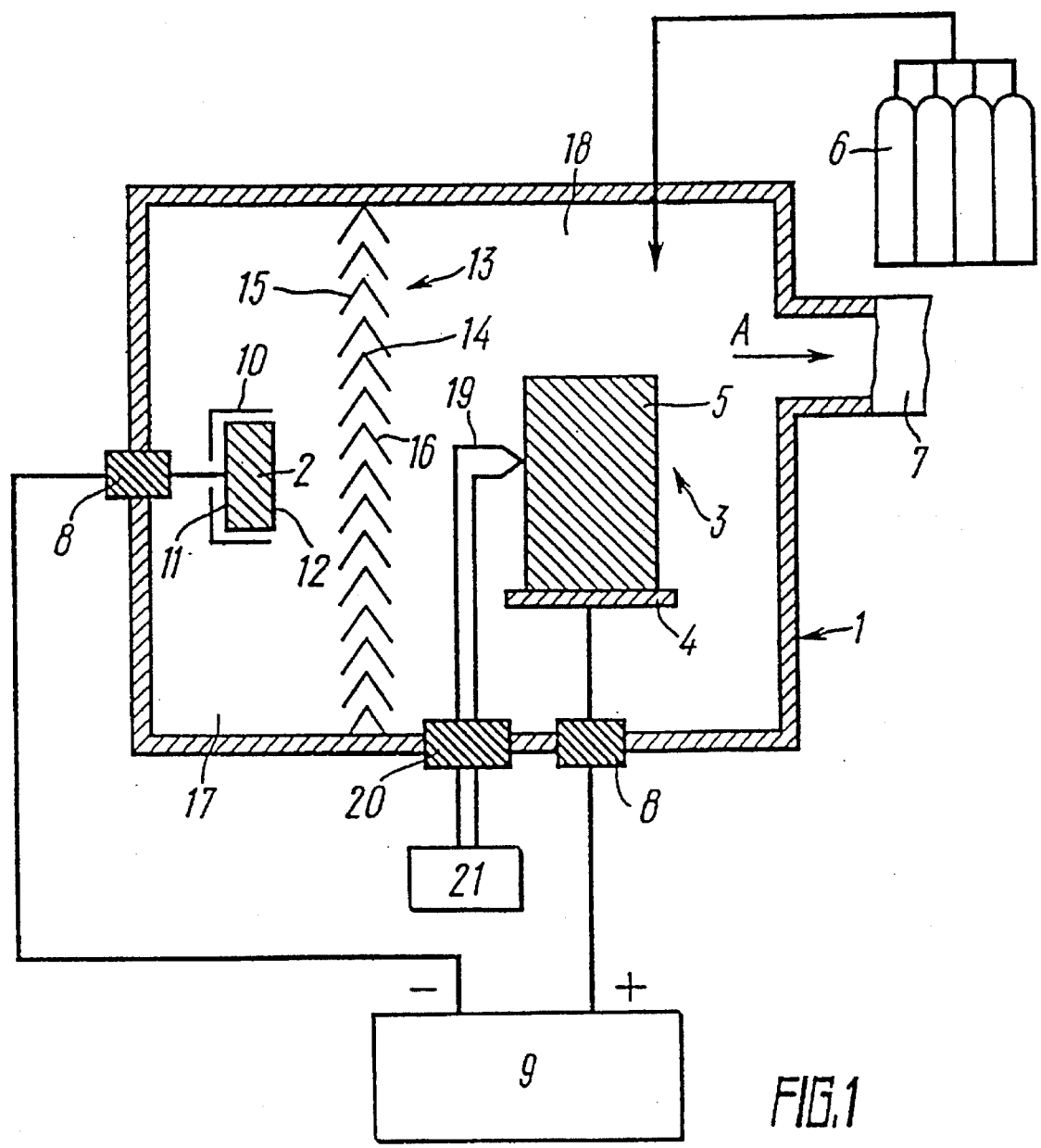
FIG. 1 is a general schematic diagram of the proposed device for treatment of products in gas-discharge plasma, carrying into effect the method for treatment of products in gas-discharge plasma, according to the invention, showing a longitudinal sectional view of the working chamber of the device.

The method for treatment of products in gas-discharge plasma according to the invention, consists in that a two-step vacuum-arc discharge is initiated between the anode and the integrally cold cathode, a vacuum-plasma treatment of the product by its being preheated to working temperature and then held in a preset temperature range in the medium of the working gas. The two-step vacuum-arc discharge initiated between the anode and the integrally cold cathode has a metal-gaseous step of plasma and a gaseous step of plasma (gas discharge). The latter step is established by ionizing the working gas with electrons separated from the metal-gaseous step of plasma of the vacuum-arc discharge. When a vacuum-arc discharge is initiated between the integrally cold cathode and the anode in the presence of the working gas, the interelectrode space is filled with metal-gas plasma in which metal ions are present, generated by the cathode spot of the vacuum arc, as well as gaseous ions resulting from the process of metal ion recharging in the interelectrode space. When separating an electron flow from an ion flow in the interelectrode space, the electrons separated from the metal-gaseous step of plasma are accelerated under the effect of the electric field generated by the anode and ionize the working gas confined in the space surrounding the anode.

The aforesaid space is filled with the working gas plasma alone, being devoid of metal ions, whereas all the merits of the vacuum-arc discharge are retained, that is, a strong discharge electron current.

The magnitude of electron current that can be obtained in a vacuum-arc discharge has a lower limit bound by the minimum stable arcing current (depending on the material of the cathode and the way of cathode spot retention on the cathode, the arcing current may range within 20 and 200 A).

The upper limit of the discharge current is defined by the thermophysical properties of the cathode being cooled. The cathode working surface must not be heated during operation to a temperature at which erosion is increased, said temperature depending on the melting point of the material the cathode is made from.

High values of the vacuum-arc discharge electron current result in a higher degree of ionization of the working gas plasma and hence in a higher plasma activity.

Moreover, high values of the vacuum-arc discharge current add to the heating capacity of the discharge, which is essential for vacuum plasma treatment of large-size heavy-weight products.

Gas-discharge plasma is generated at a reduced working gas pressure that provides for a stable persistence of a vacuum-arc discharge predominantly in the range of $10^{-2}$ and 10 Pa.

The pressure range mentioned above is characteristic of an optimum region of a stable persistence of the vacuum-arc discharge since the voltage across the discharge electrodes substantially increases when the working gas pressure is above or below said range, while stability of discharge is badly affected due to current pulsation so that the discharge may spontaneously discontinue for a prolonged period of time.

The vacuum-plasma treatment including preheating of the product to working temperature and holding in a preset temperature range is carried out at the gaseous step of the vacuum-arc discharge plasma, preferably in the medium of nitrogen used as the working gas.

The vacuum-plasma treatment of products at the gaseous step of the vacuum-arc discharge plasma may be performed simultaneously with an additional treatment of the product with a directional beam of accelerated particles, in particular, with a directional beam of neutral particles, such as molecules of gases, e.g., those of argon. Inasmuch as no potential is applied to the product from an external source during treatment with a beam of accelerated particles, an efficient treatment of dielectric products is practicable, as well as that of metal products without leaving the traces of cathode spots thereon, which precludes any spoilage of the products under treatment due to a substantial deterioration of the initial quality of surface finish.

Whenever the initial quality of surface finish of the product under treatment must be preserved, or in case of vacuum-plasma treatment of products having thin-layer coating, wherein etching of the surface is inadmissible due to the danger of complete or partial destruction of the film coating, in one of the embodiments of the proposed process, according to the invention, the product under treatment is preheated to working temperature and held in a preset temperature range in the gas-discharge plasma by applying a positive potential thereto.

When a positive potential is applied to the product under treatment during its being preheated and held in a preset temperature range in the gas-discharge plasma, the product is subjected to electron bombardment. It is known commonly that no sputtering of the surface being bombarded occurs due to a low electron mass, hence the initial quality of surface finish is retained. The value of the positive potential applied to the cathode and anode equals to a few scores of volts (as a rule under 100 V). The power output of the anode may amount to 60% of a total input power applied to the discharge. In addition, no cathode spots are liable to occur on the product to which a positive potential is applied, said spots being causative of surface erosion of the product under treatment.

The preset temperature range wherein the product under treatment is held, is maintained by reducing the discharge current to a required level. If, however, said temperature cannot be maintained at a required level during reducing the discharge current to the value of a minimum current required for a stable persistence of a vacuum-arc discharge (as a rule, a few scores of Amperes), which is the case with vacuum-plasma treatment of products having a relatively low weight, the this embodiment of the proposed method proves to be impracticable.

Whenever the initial quality of surface finish of products having a relatively low weight must be preserved, use may be made of one more embodiment of the proposed method, according to the invention, wherein the product under treatment is preheated to working temperature by applying a positive potential thereto and is held in a preset temperature range in the gas-discharge plasma with a floating potential across the product being treated.

The floating potential is accepted by any product placed in plasma and to which no voltage is applied from an external source. It is due to high mobility of electrons (compared with ions) that the product gets negatively charged self-congruently to such a potential as to provide an equal number of the ions and electrons incident thereupon. When the product gets cooled due to having been de-energized, it can be reheated under a positive potential applied either continuously or intermittently thereto.

The value of the floating negative potential is inadequately high to cause such an ionic bombardment that results in sputtering of the material of the product, since the floating potential in plasma is below the threshold of material sputtering.

When preserving of the initial quality of surface finish of a heavy-weight product does not matter but it is necessary to improve the adhesive properties of the products being treated, so the product is preheated to working temperature by applying a positive potential thereto and is held in a preset temperature range by applying a negative potential thereto. Surface irregularities resulting from ionic bombardment, as well as activation of the crystallization nuclei that occurs during holding of the product in a preset temperature range under a negative potential contribute to improvement in the adhesive properties of the surface of the product under treatment.

When subjected to a vacuum-plasma treatment are products having through holes, such as sleeves or pipes, the method, according to the invention, provides for preheating of the product to working temperature in the gas-discharge plasma and holding of said product in a preset temperature range by applying a negative potential thereto, while the discharge is passed through the hole in the product. Upon applying a negative potential to the product gas ions are withdrawn from the gas-discharge discharge plasma passing through the aforesaid hole, and are accelerated by bombarding the walls, thus heating them.

Application of a negative potential to the product under treatment may be accompanied by arc-discharge breakdowns featured by an abrupt current rise and voltage drop. As a result of such a breakdown the product becomes the cathode of the vacuum-arc discharge and the cathode spot appear on its surface so that the whole energy of the vacuum-arc discharge that is generated on the cathode, is concentrated in said cathode spots. These spots cause erosion of the surface of the product under treatment, thus deteriorating the initial quality of surface finish. To ensure against this phenomenon, the product is relieved from the negative potential as soon as an arc discharge breakdown occurs and the gaseous step of the vacuum-arc discharge plasma is aleenergized. Any removal of a negative potential from the product aimed at elimination arc-discharge breakdowns is not sufficient under conditions of a two-step vacuum-arc discharge.

This can be explained by the fact that a unipolar vacuum arc can persist on the product placed in gas plasma upon the onset of an arc-discharge breakdown on the product and disconnection of the power source, since the arc can burn without supplying electrons from external sources. The electrons are supplied for the arc discharge to persist directly from gas-discharge plasma due to higher mobility of the electronic component of the plasma compared with the ion component thereof. Withdrawal of electrons from the product is carried out due to electron emission from the arc cathode spot to gas-discharge plasma charged positively with respect to the product.

It must be emphasized that application of a negative potential to the product under treatment in the working gas plasma generated according to the proposed method, is not similar to application of a negative potential to the product being treated in a glow discharge, inasmuch as, according to the proposed method, the product does not serve as the discharge cathode and the ions of a more powerful vacuum-arc discharge are used.

Application of a positive potential to the product having a through hole, however, fails to solve the problem of obtaining a uniformly hardened layer of the hole faces, because the discharge does not pass through the hole and is stricken at the product end nearest to the cathode.

Thus, preheating of products with gaseous ions involving a negative potential in vacuum-plasma treatment of product having through holes, has not virtually an alternative.

Holding of products in a preset temperature range is carried out by appropriately controlling the intensity of discharge current.

In another embodiment of the proposed method, according to the invention, wherein subjected to the vacuum-plasma treatment are such products having through holes as sleeves or pipes, the method, according to the invention, provides for preheating of the product under treatment in a preset temperature range in gas-discharge plasma by applying a negative potential to the product under treatment and holding said product in a preset temperature range under a floating potential applied to the product being treated.

It is expedient that the aforementioned process of holding the product being treated by virtue of a floating potential applied thereto be carried out when it is necessary to provide a high-rate vacuum-plasma treatment, in particular, chemical heat treatment in layers up to 20 μm thick. In such a case the vacuum-arc discharge current is maintained at a maximum level (like in preheating), hence the working gas plasma exhibits its maximum activity.

In one of the embodiments of the method, according to the invention, the product under treatment is preheated to working temperature and held in a preset temperature range in gas-discharge plasma under a floating potential applied to said product.

With a floating potential applied to the product under treatment the latter is heated by virtue of the energy of plasma particles which are not accelerated due to application of a potential to the product from an external source. Energy imparted to the plasma depends on the working gas pressure, that is, the higher the gas pressure the greater the amount of energy imparted to the gas plasma.

It is expedient that the product under treatment be preheated to working temperature and held in a preset temperature range in gas-discharge plasma under a floating potential applied to said product when performing a vacuum-plasma treatment of small-size products under 3 mm in diameter.

Such being the case, the discharge parameters (that is, working gas pressure arc discharge current) determine very neatly the temperature of the product, that is why it is necessary to strictly adhere to the aforesaid parameters, whereby the temperature of small-size products may be left out of observation, while such an observation offers some difficulties in routine industrial technological processes.

When treating small-size products, in particular, cutting tools having sharp cutting lips, no overheating of the latter occurs due to an increased concentration of charged particles that owes its origin to higher values of electric field intensity close to said cutting lips upon applying a positive or negative potential to the product under treatment.

In a general case, apart from the aforedescribed variants of preheating and holding of the product under treatment, the product may be preheated by applying a positive potential in a preset temperature range thereto, and be held applying a positive potential stepwise thereto; the product may be preheated by applying a positive potential thereto and held in a preset temperature range by applying a floating potential to the product; preheating of the product is carried out by applying a negative potential thereto and holding the product in a preset temperature range is effected by stepwise application of a positive potential thereto, preheating of the product is effected by applying a negative potential and holding the product in a preset temperature range is carried out by applying a positive potential to said product; preheating of the product is performed by applying a floating potential thereto and holding the product in a preset temperature range is carried out by applying a positive potential to the product; preheating of the product is carried out by applying a floating potential thereto and holding of the product in a preset temperature range is carried out by applying stepwise a positive potential to said product, preheating of the product by applying a floating potential thereto and holding of said product in a preset temperature range by applying a negative potential to said product.

All the variants of realization of the proposed method, according to the invention, provide for application of a coating to the surface of the product in a gaseous step of the vacuum-arc discharge, which follows the process of preheating of the product to working temperature and holding it in a preset temperature range.

According to one of the embodiments of the proposed method, application of a coating to the surface of the product being treated is accompanied by generation of a magnetic field in the gaseous step of the vacuum-arc discharge plasma, the lines of force of which are arranged in planes square with the direction of the electron flow of said vacuum-arc discharge.

The magnetic field developed according to said embodiment of the method, deflects the electron flow that conducts current in the anode-cathode discharge gap, in a preset direction. As a result, the density of the ion current increases and hence the activity of plasma and throughput capacity of the method, according to the invention, are enhanced, too.

Given below is a detailed description of some specific embodiments of the herein proposed device: for treatment of products in gas-discharge plasma, carrying into effect the method, according to the invention.

The device for treatment of products in gas-discharge plasma according to the invention, carrying into effect the proposed method comprises a working chamber 1 (FIG. 1) which accommodates an integrally cold cathode 2, an anode 3, and a holding fixture 4 for a product 5 being treated.

The chamber 1 communicates with a source 6 of working gas and has a connection 7 communicating with a pump (omitted in the drawing as not being the subject of the present invention) for air evacuation from the working space of the chamber 1 in the direction of the arrow to establish vacuum therein.

Both the cathode 2 and the anode 3 are connected, via insulators 8 built into the walls of the chamber 1, to a source 9 of direct current.

The cathode 2 has a shield 10 which establishes a non-working area and a working area 12 of the cathode 2.

Used as the anode 3 is the product 5 being treated.

The chamber 1 accommodates also a means 13 for separating electrons from the metal-gaseous step of the vacuum-arc discharge plasma, said means being located in the zone of the integrally cold cathode 2 and being impermeable to ions generated by the latter.

In this embodiment of the device, according to the invention, the means 13 appears as a set of V-shaped plates 14, their side surface 15 facing towards the cathode 2, while another surface 16 thereof faces towards the product 5.

The means 13 divides the interior space of the chamber 1 into compartments 17 and 18, of which the latter serves as the working space of the chamber 1, while the former compartment is an auxiliary one and serves for electron emission into the compartment 18.

A thermocouple 19 is held to the product 5 being treated and is brought outside of the working (vacuum) chamber 1 through an insulator 20 built into one of the walls of the chamber 1 to be connected to a temperature gauge 21 aimed at measuring the temperature of the product 5 under treatment.

The embodiment of the device discussed above, according to the invention, is expedient to be used when applying the herein disclosed method to large-size heavy-weight products, wherein the amount of heat withdrawn at the working temperature exceeds the power developed on the anode 3 at a minimum stable arcing current on the cathode 2, when the product 5 is preheated and held in a preset temperature range by applying a positive potential to the product 5, that is, the anode 3.

Figure 2:
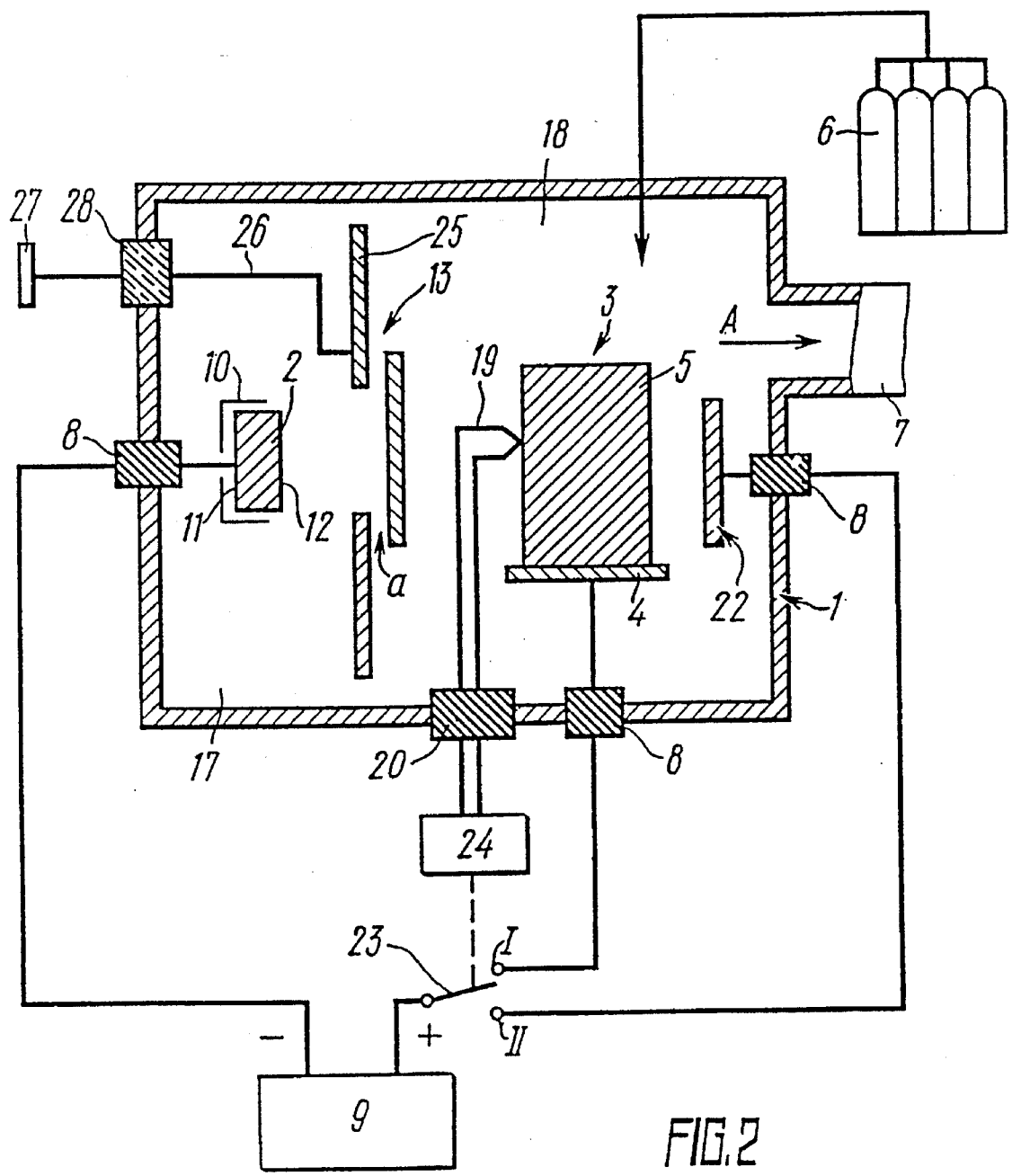
FIG. 2 is a general schematic diagram of an alternative embodiment of the device of FIG. 1.

An embodiment of the device, according to the invention, which carries into effect the method proposed herein and is represented in FIG. 2, is similar to the device of FIG. 1.

The sole difference resides in that the device of FIG. 2 is provided with an anode 22 which is so positioned with respect to the integrally cold cathode 2 and the means 13 for electron separation that the product under treatment could be interposed between the cathode 2, the means 13, and the anode 22, a two-way switch 23 connected to the direct-current source 9 and to the anode 3 and 22, and a control unit 24 of the two-way switch 23, the input of said control unit being electrically connected to the thermocouple 19, while its output is mechanically associated with the two-way way switch 23. The anode 22 is electrically isolated from the chamber 1 by the insulator 8 built into one of the walls of the chamber.

In the embodiment of the device described herein and carrying into effect the method, according to the invention, the means 13 for electron separation appears as an iris diaphragm whose leaves 25 are spaced apart at a distance "a" from one another in the zone of overlapping along the longitudinal axis of the vacuum chamber 1 and are actuated with the aid of a crank 26 having a handle 27 and held together with one of the leaves 25, said crank being brought outside the limits of the compartment 17 of the chamber 1 through a vacuum seal 28.

This embodiment of the device being disclosed herein carries into effect the method according to the invention in the following cases: when the product 5 is preheated and held at a positive potential when preheating is carried out at a positive potential and holding, at a floating potential; and when preheating and holding are carried out at a floating potential.

In addition, the embodiment under consideration carries into effect the method, whereby holding of the product 5 in a preset temperature range at the gaseous step of the vacuum-arc discharge plasma is followed by applying a coating to the surface of the product 5, consisting of a compound of the material of the integral cold cathode 2 with the working gas, e.g., nitrogen.

Figure 3:
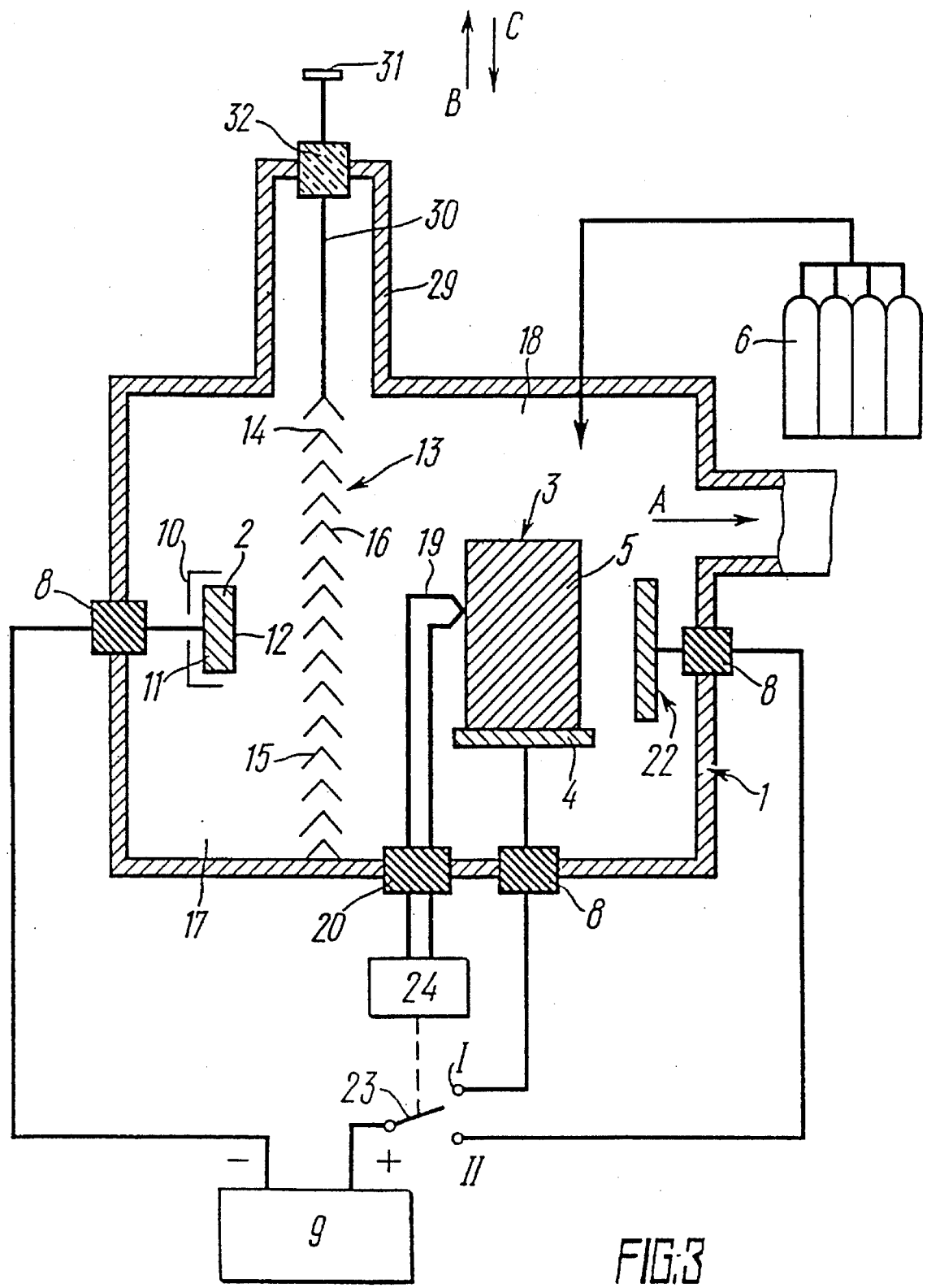
FIG. 3 is a general schematic diagram of another embodiment of the device of FIGS. 1 and 2.

An embodiment of the device, according to the invention, presented in FIG. 3 is similar to the device of FIGS. 1 and 2.

A difference consists in that the V-shaped plates 14 (FIG. 3) of the means 13 are reciprocating with respect to the walls of the chamber 1 in the direction indicated by arrows B and C. To this aim the chamber 1 is provided with a socket 29 which accommodates a connecting rod 30 provided with a handle 31 and brought outside of the socket 29 through a vacuum seal 32 built into the wall of the socket 29. The opposite end of the connecting rod 30 is secured together with the plates 14. This embodiment of the device proposed herein can find most utility when used for adding to the wear-resistance of the products that have passed the vacuum-plasma treatment, in particular, chemical heat treatment, by subsequently applying a wear-resistant coating to the surface of the product, said coating consisting of a compound of the metal from which the integrally cold cathode 2 is made, with the working gas, i.e., nitrogen. As far as the treatment techniques are concerned the present embodiment of the device differs in nothing from the preceding embodiment as shown in FIG. 2.

Figure 4:
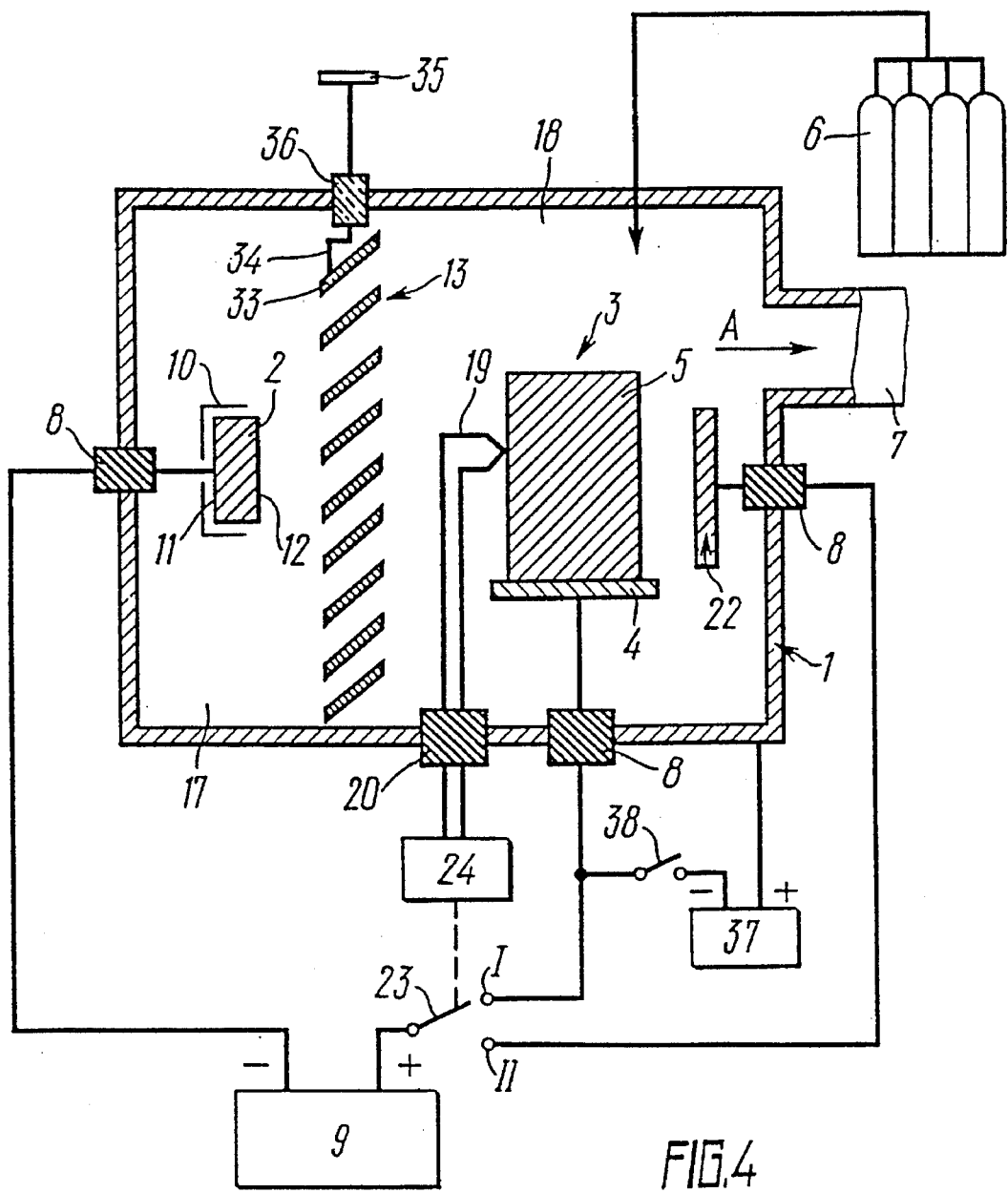
FIG. 4 is a general schematic diagram of one more embodiment of the device of FIG. 3.

An embodiment of the device shown in FIG. 4 for carrying into effect the method, according to the invention, is similar to the device of FIG. 3.

The sole difference from the preceding embodiment resides in that the means 13 (FIG. 4) for electron separation is shaped as louverboards whose slats 33 are connected to the connecting rod 34 provided with the handle 35 and brought out of the compartment 17 of the working space of the chamber 1 through a vacuum seal 36 built into one of the walls thereof.

The device in question comprises one more source 37 of direct current whose negative pole is connected, via a switch 38, to the holding fixture 4 of the product 5, and its positive pole is connected to the chamber 1.

This embodiment of the device carries into effect the method according to the invention, is applicable in cases where the product 5 is preheated by virtue of a positive potential applied thereto, and is held in a preset temperature range by applying a negative potential thereto, where the product 5 is preheated and held at a floating potential applied thereto, where the product 5 is preheated at a negative potential and held at a positive potential applied stepwise thereto; where preheating and holding of the product 5 are carried out at a negative potential applied thereto where preheating is effected at a negative potential and holding, at a positive potential applied to the product 5; where the heating is performed at a negative potential and holding at a floating potential applied to the product 5; where preheating is carried out at a floating potential and holding, at a positive potential applied to the product 5; and where preheating is effected at a floating potential and holding, at a negative potential applied to the product 5.

In addition, this embodiment of the device carries into effect the proposed method whenever the products that have passed the vacuum-plasma treatment, in particular, chemical heat treatment, are to be coated subsequently with a wear-resistant coating aimed at increasing the wear-resistant properties thereof, said coating being in fact the material of the cathode 2 or a compound of said material with the working gas, i.e., nitrogen.

Figure 5:
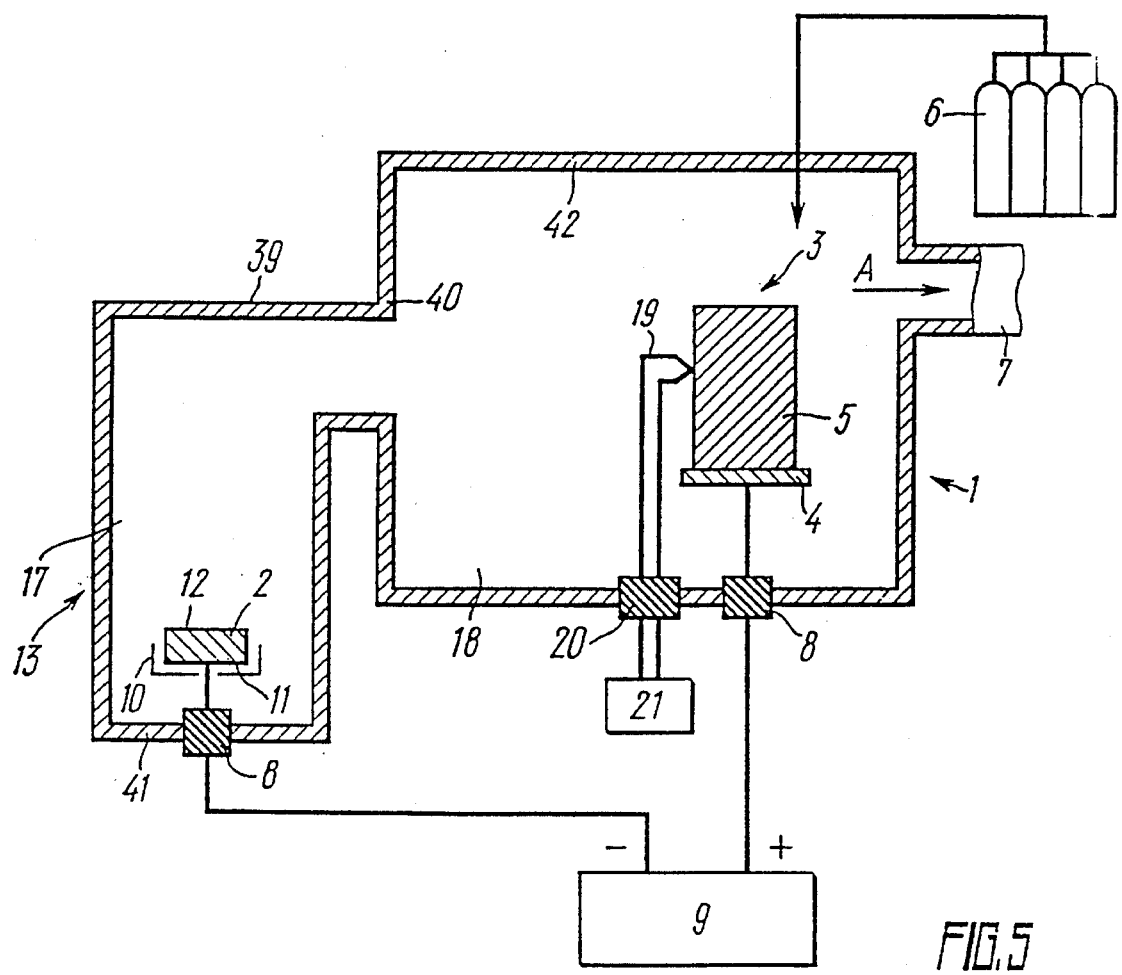
FIG. 5 is a general schematic diagram of one of the embodiments of the device of FIG. 1.

An embodiment of the device shown in FIG. 5 and carrying into effect the method, according to the invention, is similar to the device of FIG. 1.

The sole difference from the preceding embodiment consists in that the means 13 (FIG. 5) for electron separation appears as an L-shaped branch 39 whose end 40 communicates with the chamber 1 and faces towards the anode 3, whereas the cathode 2 is situated in close proximity to an end 41 of said branch 39, the working area 12 of said cathode 2 being located out of the zone of direct optical view of internal walls 12 of the chamber 1.

The device of FIG. 5 carries into effect the herein-proposed method, wherein the product 5 is preheated and held in a preset temperature range by being energized with a positive potential applied thereto.

It is however obvious that the embodiment of the device with the means 13 shaped as the L-shaped branch 39 may he used in the device shown in FIGS. 2, 3, and 4 for carrying out the vacuum-plasma treatment using the process techniques inherent in the devices described before and in illustrated FIGS. 2, 3, and 4.

Figure 6:
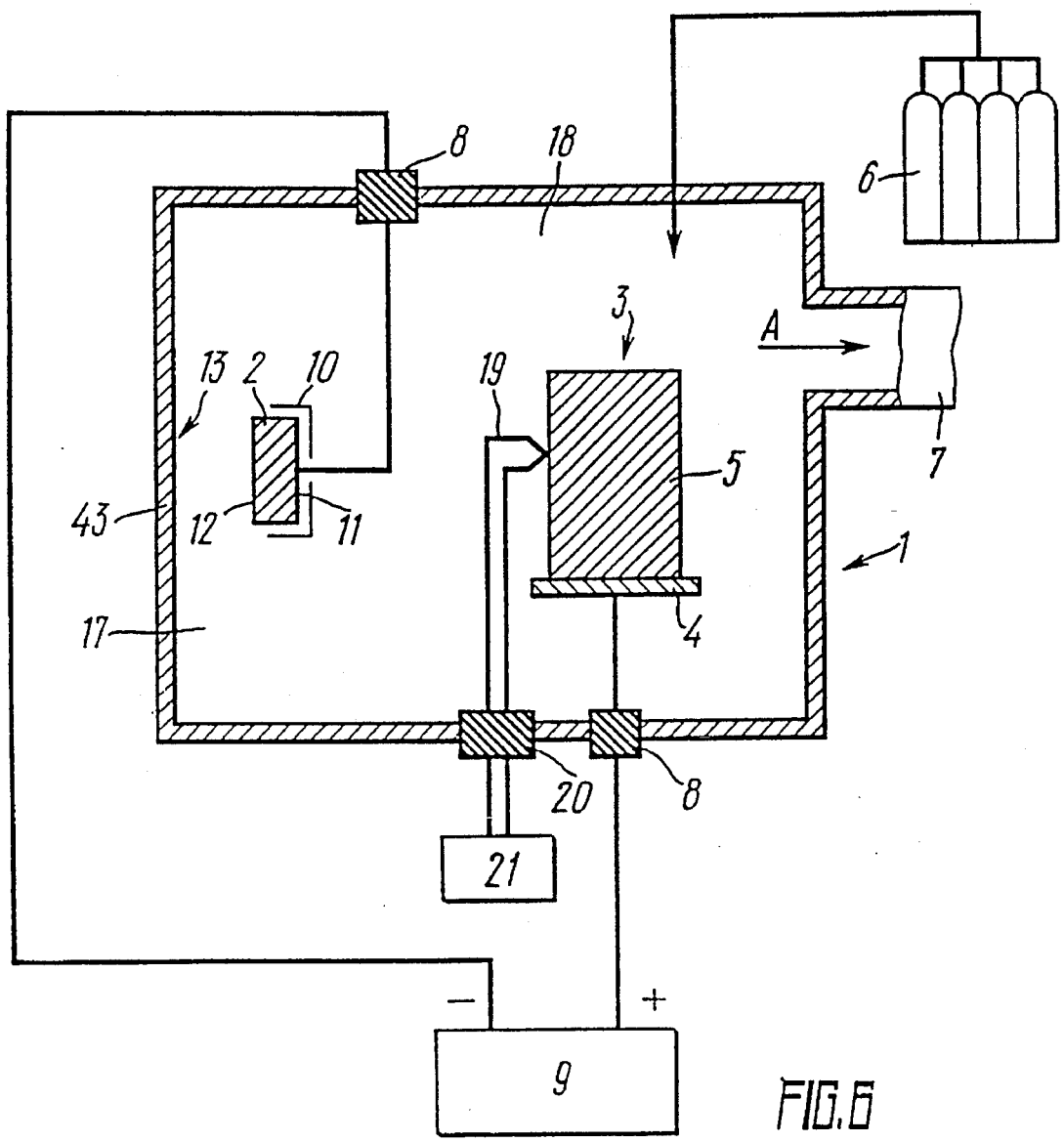
FIG. 6 is a general schematic diagram of still more embodiment of the device of FIG. 1.

One more embodiment of the device carrying into effect the method disclosed herein is presented in FIG. 6.

The embodiment of the device shown in FIG. 6 and carrying into effect the method, according to the invention, is similar to the device shown in FIG. 1.

The sole difference consists in that serving as the means 13 (FIG. 6) for electron separation is a wall 43 itself of the vacuum chamber 1, said wall being situated in the zone of the integrally cold cathode 2, which is so positioned that its working area 12 faces towards said wall 43.

The device shown in FIG. 6 carries into effect the method disclosed herein, wherein the product 5 is preheated and held in a preset temperature range by applying a positive potential thereto.

This embodiment, however, wherein the integrally cold cathode 2 is so arranged that its working area 12 faces oppositely the anode 3 and wherein the corresponding wall of the chamber 1 serves as the means 13, is also applicable in the device of FIGS. 2, 3, and 4.

Figure 7:
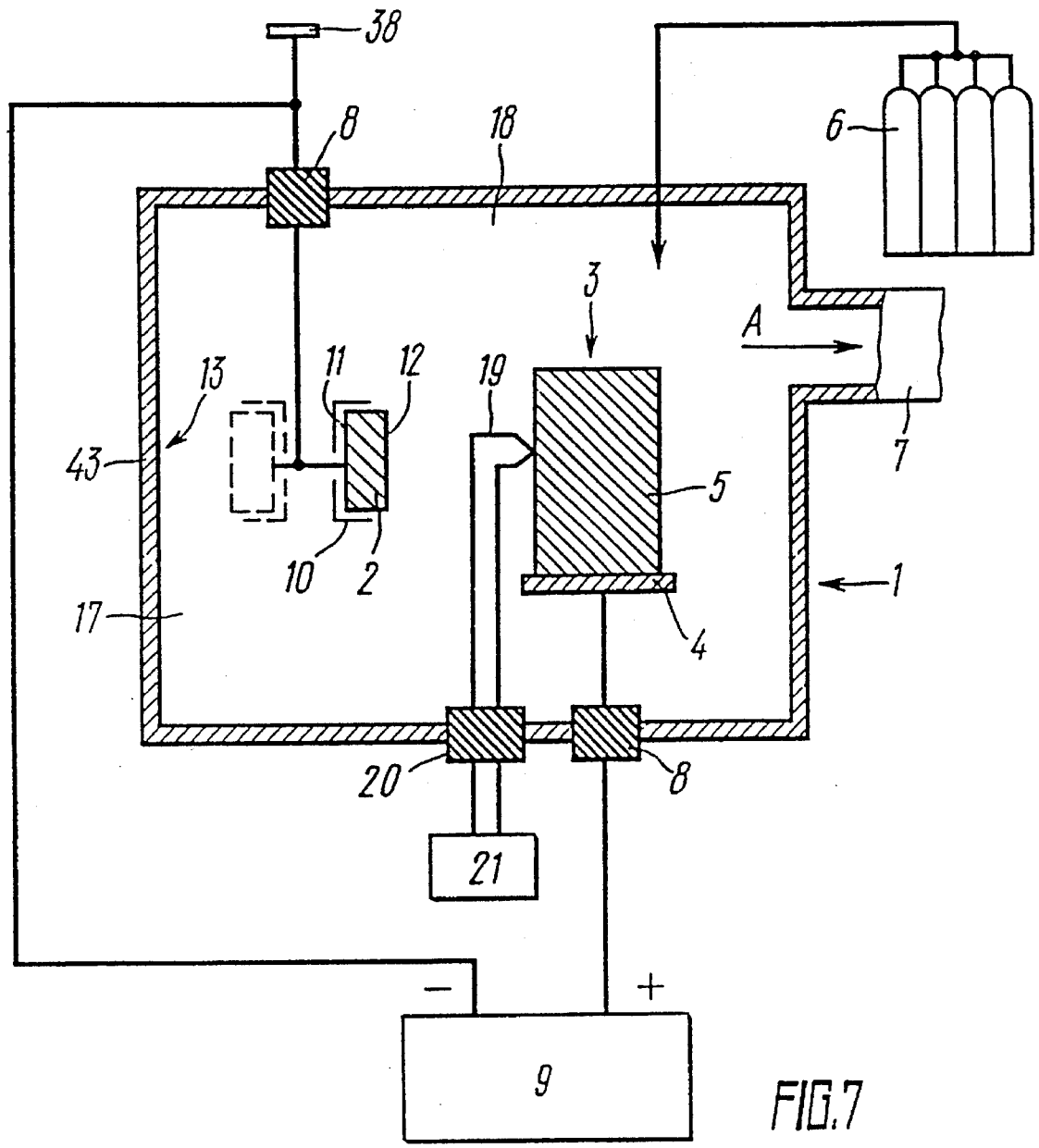
FIG. 7 is a general schematic diagram of another embodiment of the device shown in FIG. 6.

Another embodiment of the device is shown in FIG. 7 and is similar to the device of FIG. 6. The sole difference lies with the fact that the integrally cold cathode 2 (FIG. 7) is so positioned that its working area 12 be angularly displaceable through 180° with respect to the wall 43 as shown with a dotted line in FIG. 7.

The device shown in FIG. 7 realizes the method disclosed herein, according to which the product 5 is preheated and held in a preset temperature range by being supplied with a positive potential.

Figure 8:
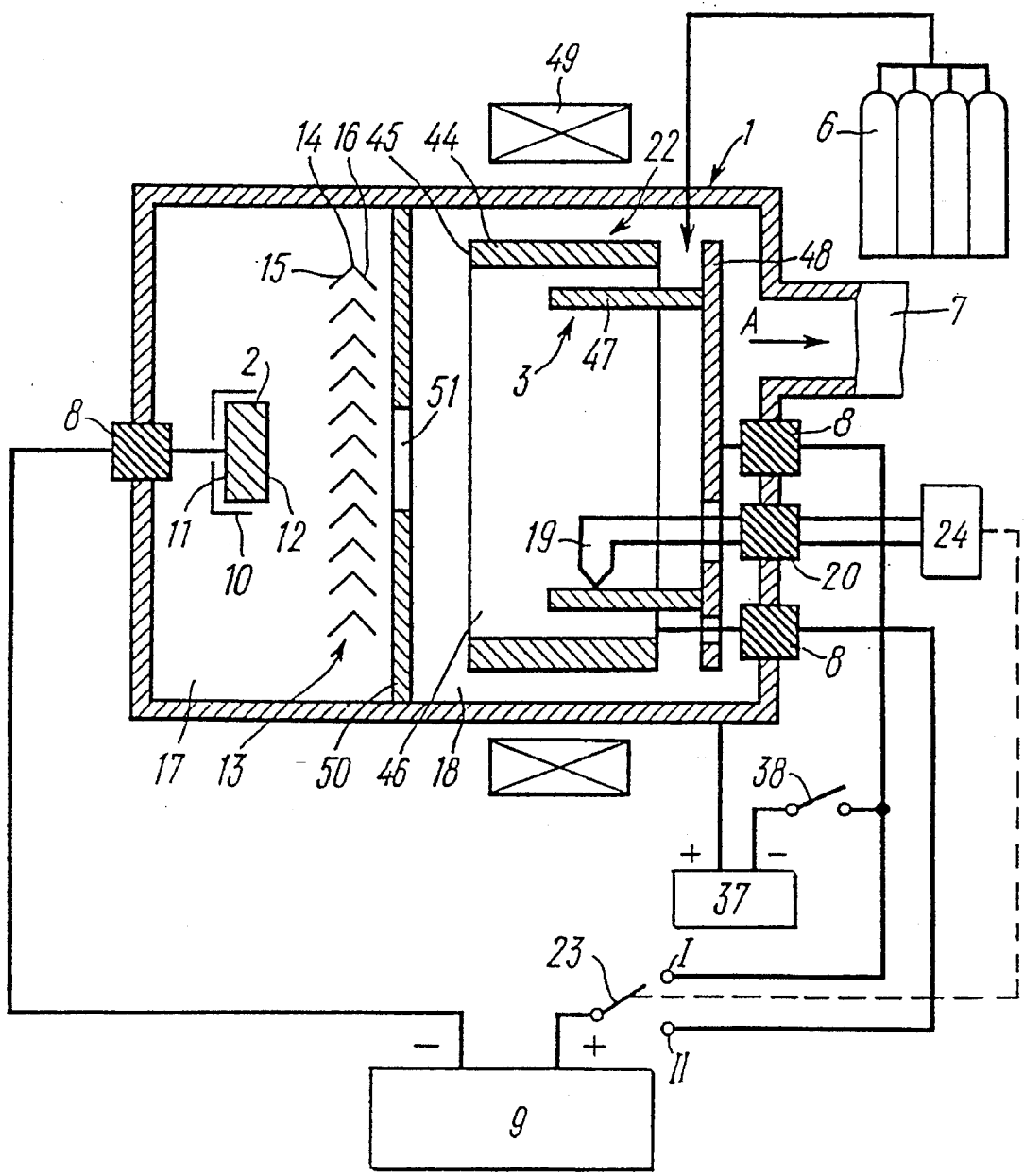
FIG. 8 is a general schematic diagram of one of the embodiments of the device as shown in FIGS. 1 and 4.

An embodiment of the device, according to the invention, as presented in FIG. 8 is similar to the device of FIGS. 1 and 4.

The sole difference is in that the anode 22 (FIG. 8) is shaped as a hollow cylinder 44 having its end 45 facing towards the cathode 2 and whose interior 46 accommodates a product 47 under treatment appearing as rods held to a fixture 48. The cylinder 44 is encompassed by a solenoid 49 situated outside of the chamber 1. A disk 50 provided with a center hole 51 is accommodated in the chamber 1 and set coaxially with the cylinder 44 between the V-shaped plates 14 of the means 13 and the end 45 of the cylinder 44 in close proximity to both.

The device discussed above can be used for intensifying the process of vacuum-plasma treatment, as well as for realization of the process disclosed herein in cases where the product 47 under treatment is preheated to working temperature and held in a preset temperature range in gas-discharge plasma at a floating potential applied to the product 47, as well as where the product 47 is preheated to working temperature and held in a preset temperature range at a positive potential and a floating potential respectively. In both of the cases mentioned before it was expedient that a preset temperature at which the product 47 is to be held be maintained by stepwise application of a positive potential thereto.

Figure 9:
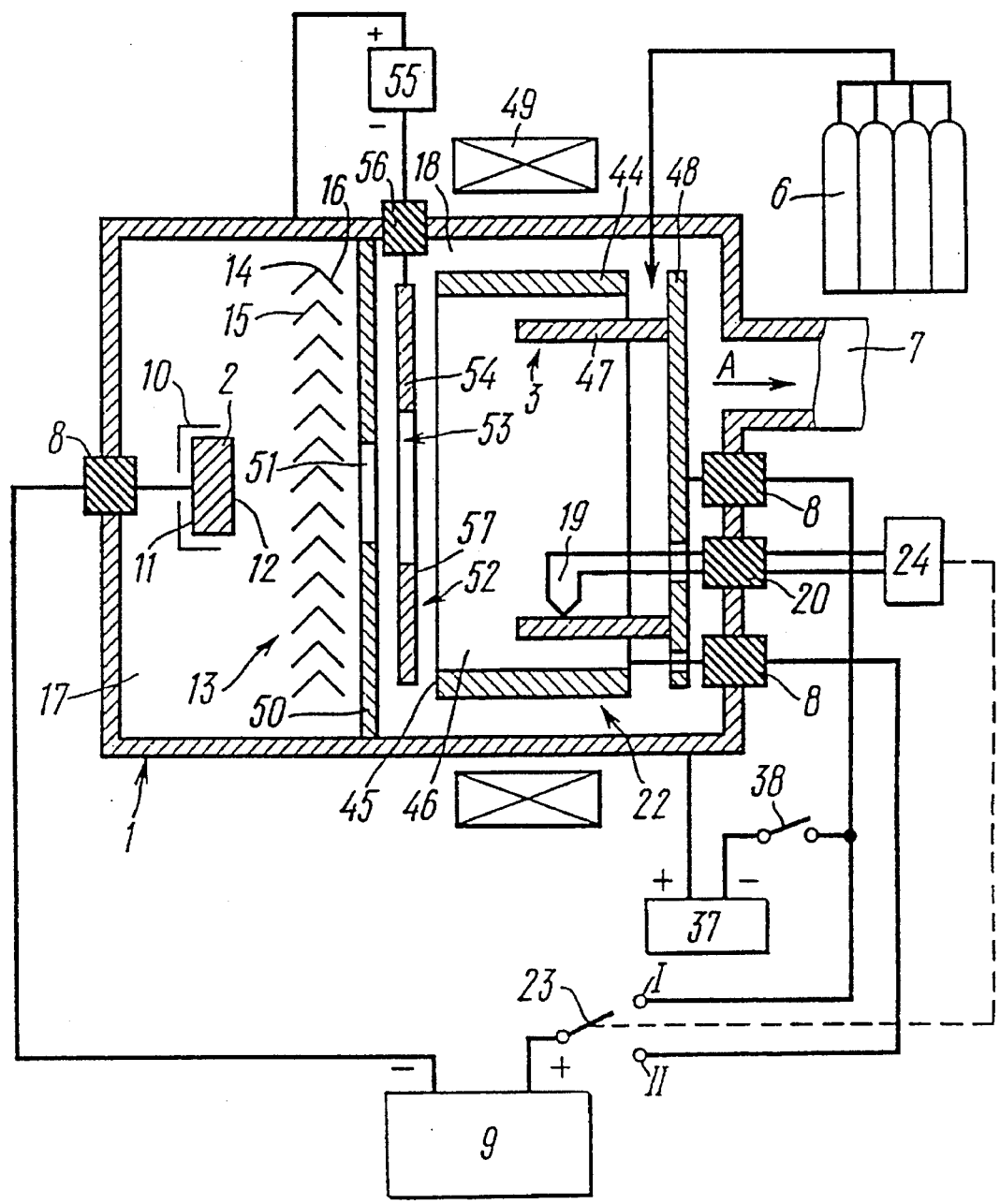
FIG. 9 is a general schematic diagram of one more embodiment of the device according to the invention as shown in FIG. 8.

The device of FIG. 9 is similar to that of FIG. 8.

The sole difference resides in that provision is therein made for a sputtering target 52 (FIG. 9) having a center hole 53, said target being interposed between the plates 14 of the means 13 and the end 45 of the cylinder 44 and arranged coaxially with the disk 50 and the cylinder 44.

The sputtering target 52 in this embodiment of the device is in fact a disk 54 having the center hole 53.

The sputtering target 52 is connected to the negative pole of an individual source 55 of direct current through an insulator 56 built into the wall of the chamber 1 and has a sputtering surface 57.

The embodiment of the device described above is reasonable to be used for intensifying the process of vacuum-plasma treatment, as well as in carrying into effect the proposed method when the product 47 under treatment is preheated to working temperature and held in a preset temperature range in gas-discharge plasma at a floating potential applied thereto, and also when preheating of the product 47 to working temperature is carried out at a positive potential and holding of said product is performed at a floating potential applied thereto. In both cases mentioned above it is expedient that a preset holding temperature of the product 47 be maintained by stepwise application of a positive potential thereto.

In addition, the embodiment of the device under consideration can be used for increasing the wear-resistance of the products that have passed the vacuum-plasma treatment, in particular, chemical heat treatment, by subsequent application of a wear-resistant coating, consisting of the compound of the metal from which the sputtering target 52 is made with the working gas, i.e., nitrogen, or other.

Figure 10:
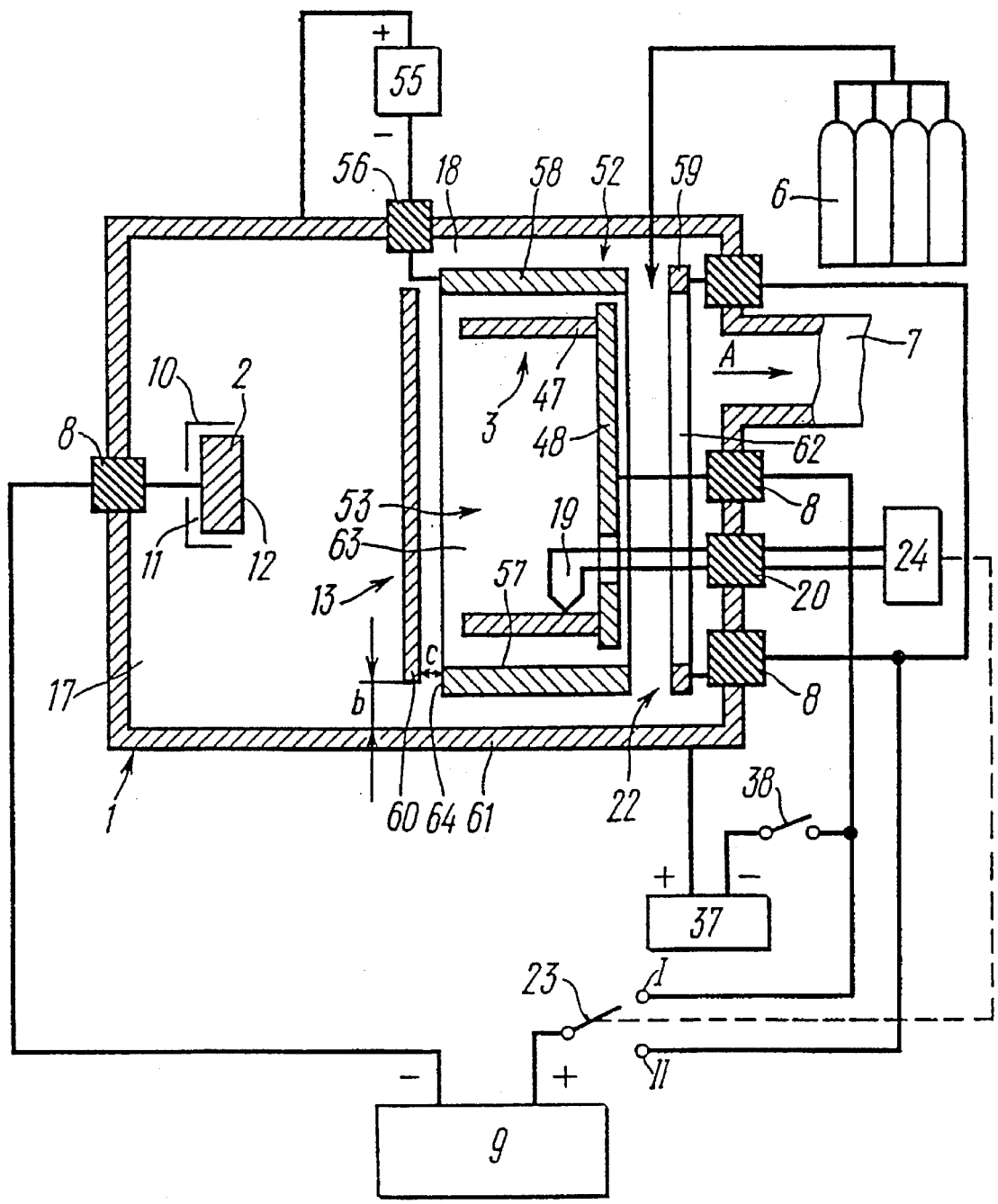
FIG. 10 is a general schematic diagram of one of the embodiments of the device as shown in FIG. 9.

The device of FIG. 10 is similar to that of FIG. 9.

The sole difference resides in that the sputtering target 52 (FIG. 10) appears as a hollow cylinder 58, the anode 22 is shaped as a ring 59, and the means 13 for electron separation is shaped as a disk 60 set with a clearance "b" relative to walls 61 of the vacuum chamber 1. An interior space 62 of the ring 59 and an interior space 63 of the cylinder 58 are equal in cross-sectional area.

The holding fixture 48 for the product 47 under treatment is situated in the interior space 63 of the cylinder 58. The disk 60 has a clearance "c" with respect to an end 64 of the cylinder 58. The interior space 63 of the cylinder 58 is in fact the center hole 53 of the target 52 having the sputtering surface 57.

The aforementioned embodiment of the device is expedient to be used for intensifying the process of application of a wear-resistant coating to the product 47 after its having passed the vacuum-plasma treatment, in particular, chemical heat treatment, said coating consisting of the material the sputtering target 52 is made from.

As far as the process techniques involved in the vacuum-plasma treatment is concerned, that is, preheating of the product under treatment and its holding in a preset temperature range, the present embodiment of the device is similar to the preceding one.

Figure 11:
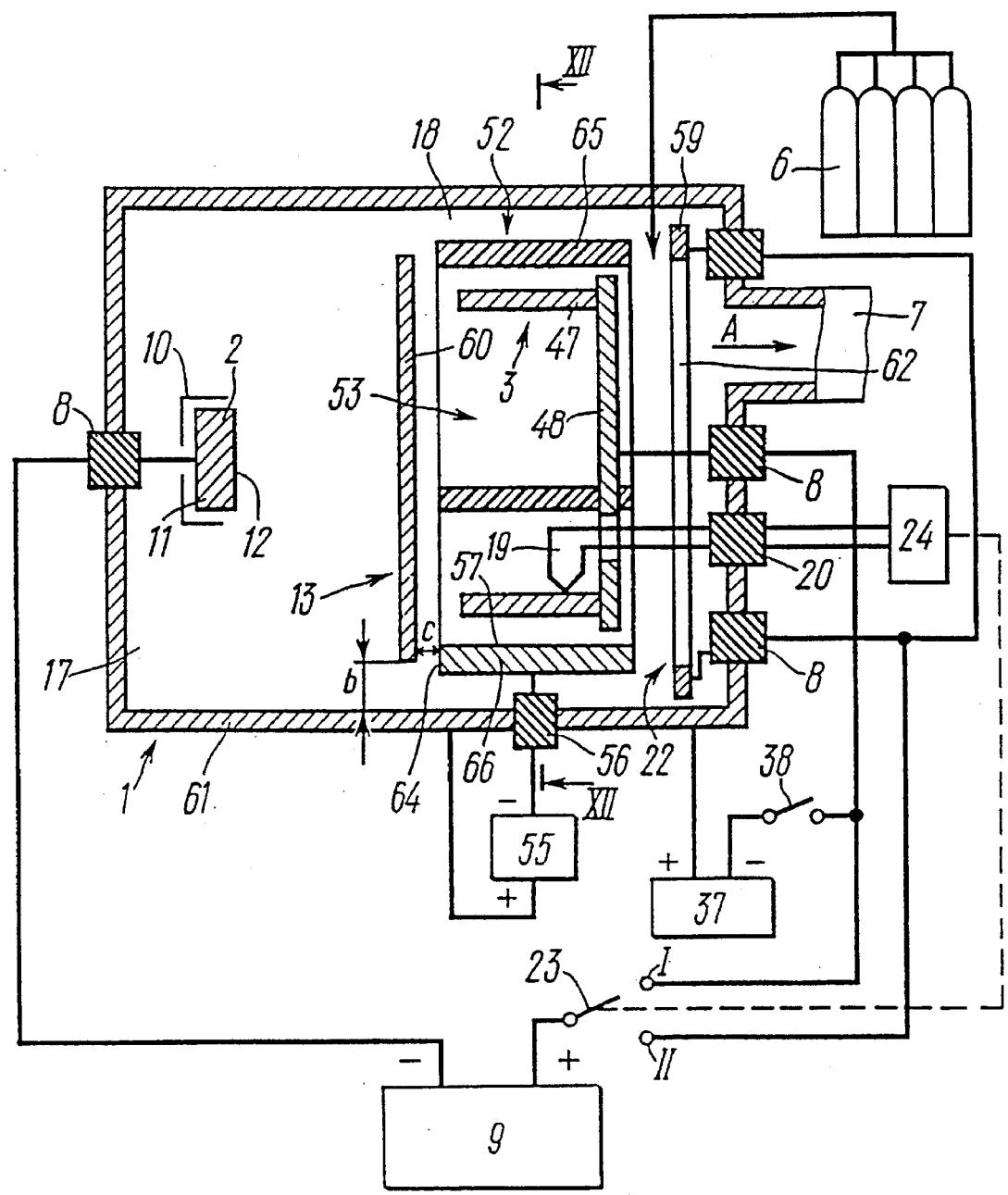
FIG. 11 is a general schematic diagram of one more embodiment of the device as shown in FIG. 10.
Figure 12:
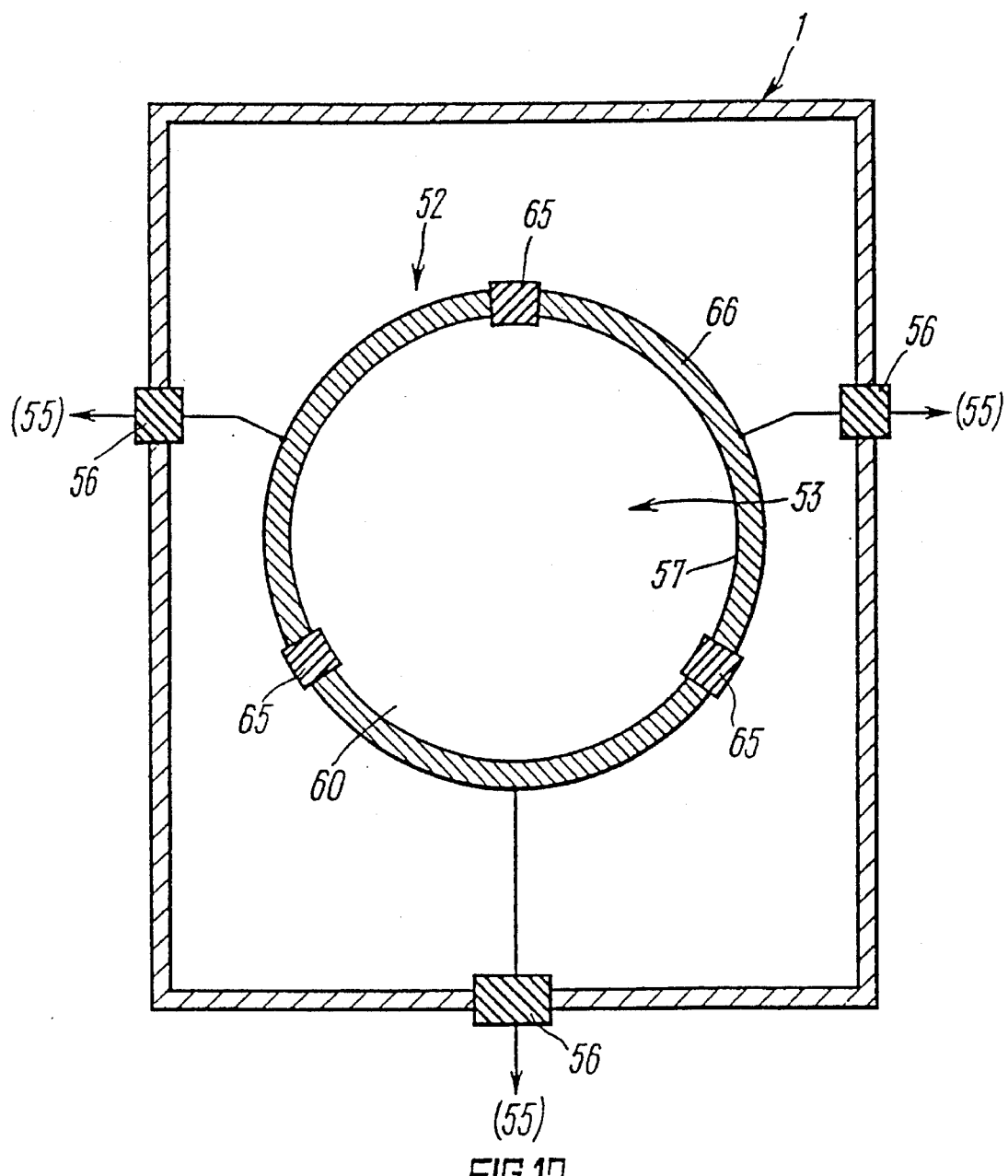
FIG. 12 is a section taken along the line XII—XII in FIG. 11.

The device, according to the invention, carrying into effect the method disclosed herein and presented in FIGS. 11 and 12 is similar to the device of FIG. 10.

The sole difference lies with the fact that the sputtering target 52 (FIGS. 11 and 12) appears as a set of arcuate plates 66 insulated from one another by insulators 65 and arranged circumferentially as shown in FIG. 12, thus establishing the center hole 53 of the sputtering target 52 having the sputtering surface 57.

In the herein-described embodiment of the device the cross-sectional area of the interior space 62 (FIG. 11) of the ring 59 exceeds the cross-sectional area of the center hole 53 of the sputtering target 52.

The present embodiment of the device is reasonable to be used for obtaining high-quality hard coatings, since such a construction arrangement of the target 52 reduces very much the danger of arc discharges stricken on its surface and hence rules out the formation of the drop phase in the coating applied to the product 47.

Figure 13:
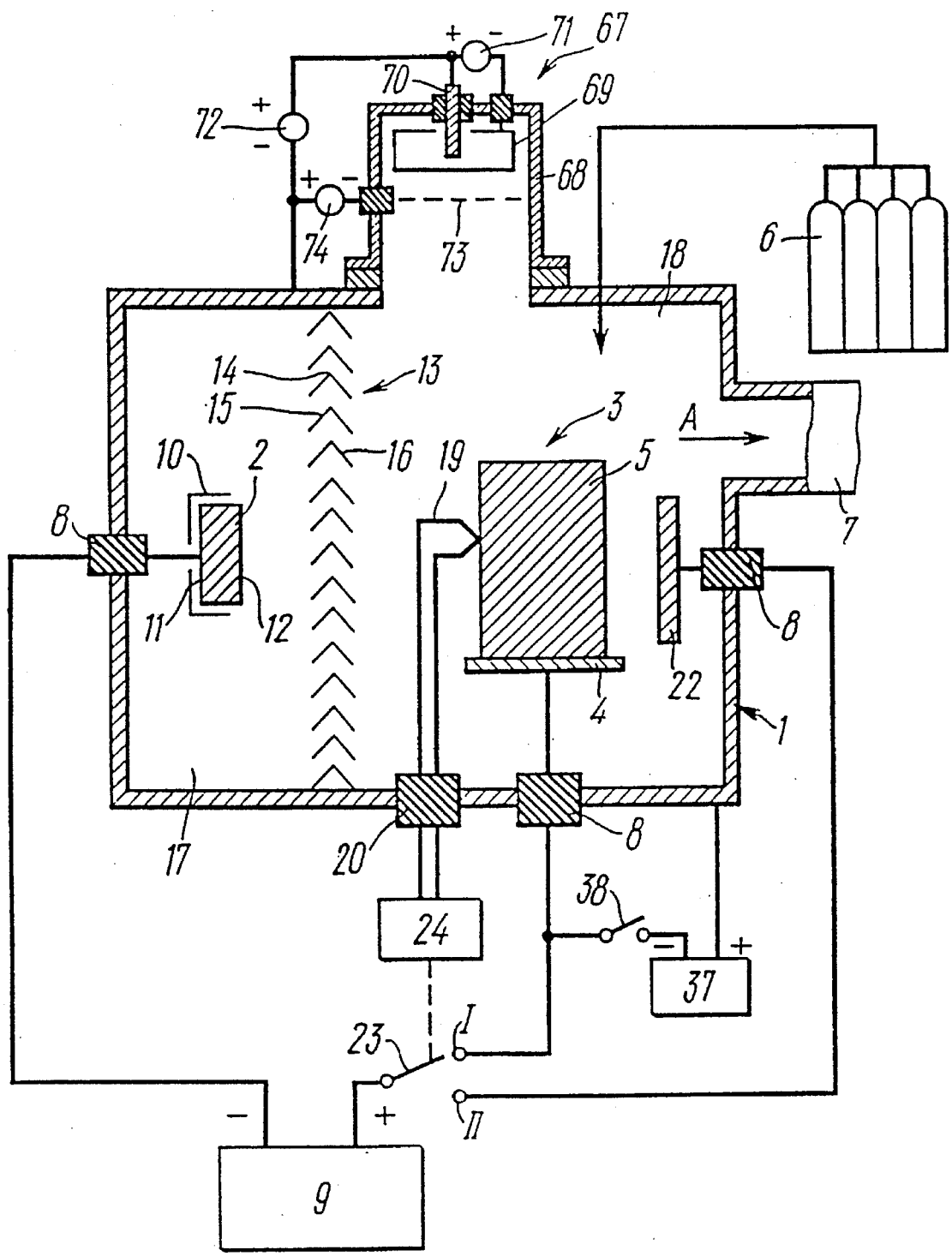
FIG. 13 is a general schematic diagram of one of the embodiments of the device, according to the invention, as shown in FIGS. 1 and 4.

The device presented in FIG. 13 is similar to that of FIGS. 1 and 4.

The sole difference resides in that provision is made in the device of FIG. 13 for a source 67 of accelerated particles which is connected to the vacuum chamber 1 and comprises a gas-discharge chamber 68 accommodating a hollow cold cathode 69, an anode 70, a means 71 for power supply of a discharge initiated in the gas-discharge chamber 68, said means 71 being connected to the cathode 69, the anode 70, and a means 72 of an accelerating voltage having its negative pole connected to the vacuum chamber 1. The source 67 is also provided with an emission grid 73 connected to the negative pole of a power supply source 74 which in turn is connected to the means 72.

This embodiment of the device is expedient to be used for preheating the product 5 and its holding under a floating potential applied thereto with a view to enhancing the efficiency of the process of vacuum-plasma treatment predominantly of products made from dielectric materials.

The mode of operation of the herein-disclosed device for treatment of products in gas-discharge plasma which carries into effect the method, according to the invention, is as follows.

Air is evacuated from the vacuum chamber 1 (FIG. 1) by means of the pump (omitted in the drawing) through the connection 7 until a pressure established in the chamber 1 gets lower than the working pressure by about one order of magnitude. Once the chamber 1 has been deaerated, the working gas is admitted to fill the chamber. Considered hereinafter is a specific embodiment of the herein-disclosed method as applied to the nitriding process which is most commonly used under industrial conditions in cases where nitrogen is employed as the working gas. Nitrogen in this particular case is fed from the source 6 of working gas, its pressure being set within $10^{-2}$ and 10 Pa.

A voltage is applied to the anode 3 and the integrally cold cathode 2 from the source 9 of direct current. Then the cathode spot is initiated on the cathode 2 with the aid of a vacuum-arc discharge initiation system (omitted in the drawing as being known conjointly and therefore not being the subject of the present invention).

The cathode spot thus initiated moves over the working area 12 of the cathode 2, whereas the cathode spot cannot travel over the nonworking area 11 of the cathode 2 because the entire nonworking area 11 of the cathode 2 is covered by the shield 10 which is insulated from the cathode 2, thus precluding electric connection between the cathode 2 and the anode 3 through the plasma column.

The plasma column generated by the cathode spot consists of metal ions (that is, the products of erosion of the material the cathode 2 is made from), which are ionized in the near-the cathode zone of the vacuum-arc discharge and propagate away from the cathode 2 at a high velocity along straight line paths, and of electrons. Apart from metal ions the plasma column incorporates the working gas ions which result from the recharging process upon colliding of the metal with the neutral working gas molecules. Inasmuch as the metal ions propagate along straight line paths, and the electron separation means 13 is interposed between the cathode 2 and the anode 5, the metal ions are held back on the V-shaped plates 14 and get condensed thereon. The electrons of the metal gaseous plasma are activated by the electric field of the anode 3 which passes through the gaps between the V-shaped plates 14 of the means 13 to make their way from the compartment 17 of the chamber 1 containing the metal-gaseous plasma to the compartment 18 thereof so as to ionize the working gas contained in said compartment and establish the gaseous plasma through which the vacuum-arc discharge current is free to pass.

Thus the means 13 is essentially a boundary between two physically dissimilar regions, that is, the region of the metal-gaseous plasma filling the compartment 17 of the chamber 1 and the region of pure gaseous plasma filling the compartment 18 of the chamber 1.

A peculiar feature of the vacuum-arc discharge is the fact that the electron currents of such a discharge are limited only to the thermophysical properties of the integrally cold cathode 2. It is known commonly that to provide a vacuum-arc discharge current magnitude of a few hundreds or even thousands amperes is readily attainable. With such high current intensity values the gaseous plasma in the compartment 18 of the chamber 1 features a high degree of ionization (of the order of a few tens percent) and therefore high activity.

The surface of the anode 3, i.e., the product 5 under treatment is heated as a result of electron bombardment said surface is exposed to. The temperature of the surface is monitored with the aid of the thermocouple 19 made fast on the product 5. Once the working temperature of the product 5 has been attained, the discharge current intensity is reduced to a value at which the power developed on the anode 3 gets equal to the amount of heat withdrawn from the product 5 (both through heat radiation and transfer). It is at such a current that the product 5 is held in a preset temperature range during which the surface layer of the product 5 is saturated with the working gas, that is the process of the vacuum-plasma treatment, in particular, chemical heat treatment is carried out. The lower limit of the vacuum-arc discharge current is a minimum current of a stable persistence of such a discharge below which the discharge proceeds but unstably. For the cathode 2 made of diverse materials such a current is of the order of tens of amperes. That is why the device, wherein the anode 3 is in fact the product 5 (which is constructionally the simplest one) is applicable for vacuum-plasma treatment of relatively robust products featuring considerable rate of heat withdrawal at working temperatures. Conduct of vacuum-plasma treatment at a positive potential is advantageous in that electron bombardment of the surface of the product 5 is not causative of surface sputtering, therefore the product 5 subjected to such a vacuum-plasma treatment preserves the initial quality of surface finish. This of prime importance whenever the vacuum-plasma treatment, in particular, chemical heat treatment is carried out of such products that are provided with a thin-film cuating applied to their surface, which may be partly or even fully destructed by ionic bombardment (that is, under a negative potential applied to the product).

The device illustrated in FIG. 2 and carrying into effect the method, according to the invention, wherein the product 5 is held in a preset temperature range both at a positive and floating potential, is free from any restrictions imposed on carrying out the treatment of products regardless of their weight.

The device operates as follows.

The product 5 is preheated by applying a positive potential thereto, which is supplied from the source 9 of direct current. The two-way switch 23 is in the position I, as soon as the temperature of the product 5 reaches the preset value the control unit 24 shifts the two-way switch to the position II, wherein the discharge anode is in fact the anode 22, while the product 5 is under a floating potential. Since the vacuum-arc discharge current retains its initial value after the discharge has passed from the anode 3 to the anode 22, the gas-discharge plasma retains its activity at an unaffected level. This makes the present construction of the device favorably comparable with the construction shown in FIG. 1, wherein the temperature control of the product 5 is effected due to reduction of the discharge current and hence of the rate of the process of vacuum-plasma treatment.

The device of FIG. 2 can be applied in the same way as the device or FIG. 1 but with the two-way switch 23 in the position I.

Figure 14:
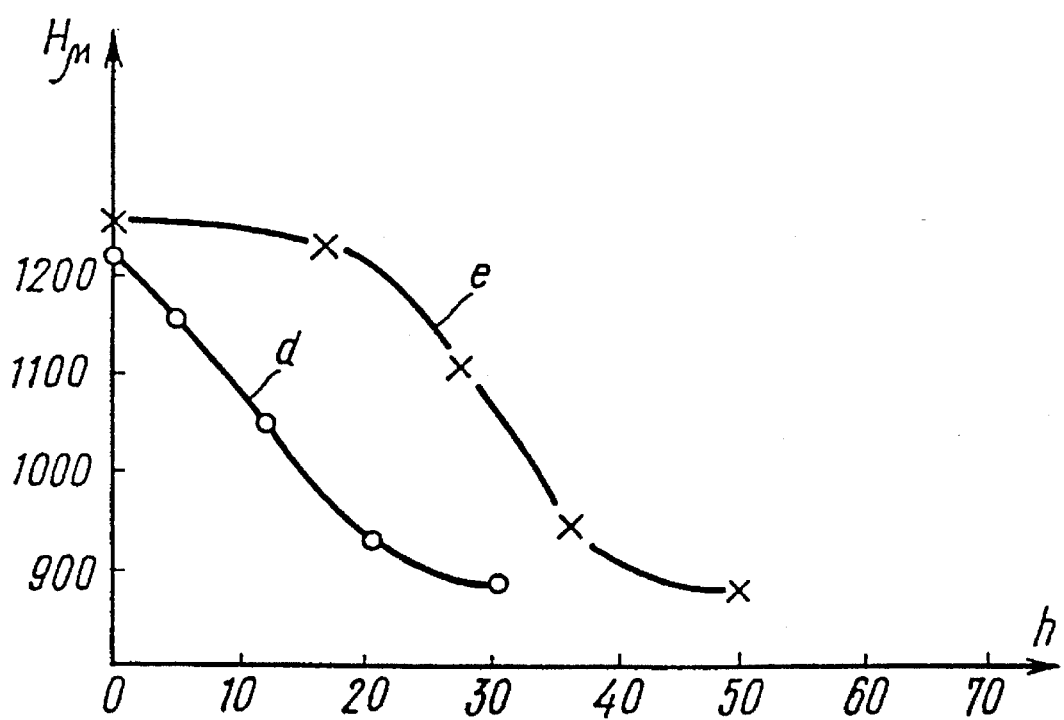
FIG. 14 presents a characteristic curve of microhardness of the nitrided layer of the product being treated vs. the depth of said layer for high-speed tool steel as attained by the device of FIG. 2.

The graphic chart presented in FIG. 14 represents the efficiency of the process of vacuum-plasma treatment carried out using the device illustrated in FIG. 2.

There is carried out nitriding of the product 5 made of high-speed tool steel having the following chemical analysis (in wt. %): W, 6.1, C, 0.8, Mo, 5.1; Cr, 4.0; Va, 1.8; Fe being the balance.

The product 5 is preheated by applying a positive potential thereto and held in a preset temperature range under a combination of a positive and a floating potential. The temperature of the product 5 is maintained at a preset level by changing the two-way switch 23 over from the position I to the position II, and vice versa. The parameters of the process vacuum-plasma treatment, the chemical heat treatment in this particular case, are as follows: partial nitrogen pressure, $8 \times 10^{-2}$ Pa; vacuum-arc discharge current, 120 A, voltage between the anodes 3, 22 and the cathode 2, 60 V, period of holding at 400° C., 35 min, at 500° C., 35 min.

The graphic chart shown in FIG. 14 represents microhardness Hu of the nitrided layer in mPa (plotted against X-axis) versus the depth "h" of the layer in microns (plotted against Y-axis for two temperatures, i.e., 400° C. (curve "d") and 500° C. (curve "e").

The device of FIG. 2 is expedient to be used for vacuum-plasma treatment of small-size products when preheating and holding are carried out at a floating potential applied to the product 5. In this case the two-way switch 23 is in the position II, and the vacuum-arc discharge parameters (i.e., current and voltage values) are selected to be such that the temperature of the product 5 is not to exceed the value preset according to the treatment procedure.

With such a procedure of preheating and holding the product in a preset temperature range, the temperature of the product can he maintained at a degree of accuracy quite adequate for industrial practice by keeping the vacuum-arc discharge parameters constant at a required level, whereby the use of temperature monitoring means can be dispensed with.

In the device of FIG. 3 the cathode 2 is made of such a material that forms, upon a chemical reaction with the working gas, a wear-resistant metal-containing compound, e.g., the cathode 2 may be made of titanium which, when reacting with nitrogen, forms a stable wear-resistant compound, that is, titanium nitride.

After carrying out the process of vacuum-plasma treatment of the product 5 according to one of the aforementioned embodiments of the method disclosed herein, the means 13 made as a set of the V-shaped plates 14 secured on the connecting rod 30, is raised, by means of the handle 31, to the socket 29. As a result, an unobstructed flight of metal ions generated by the cathode 2 to the surface of the product 5 under treatment is provided. Thus, a thin-film layer of a wear-resistant titanium nitride compound is formed in t,e presence of the working gas, i.e., nitrogen, on the surface of the product 5 under treatment that has passed the process of vacuum-plasma treatment, in particular, chemical heat treatment.

An all-over treatment of cutting tools made from high-speed tool steel of the following chemical composition (wt. %): W 6.1, C, 0.8; Mo. 5.1, Cr, 4.0; Va, 1,8; Fe being the balance, comprising nitriding to form a nitrided layer 15 to 25 um thick, followed by applying a wear-resistant titanium nitride layer 4 um thick, increases wear-resistance of the tools by 150–300% compared with the cutting tools that have passed chemical heat treatment alone.

In the device of FIG. 4 the source 37 of direct current enables one to hold the product under treatment in a preset temperature range at a negative potential applied thereto. To this end, once the process of preheating the product 5 at a positive potential applied thereto has been over, the two-position switch 23 is changed over to the position II, that is, the discharge is transferred from the anode 3 to the anode 22, and the holding fixture 4 of the product being treated is connected, by the switch 38, to the direct-current source 37. As a result, a high-voltage negative potential is applied to the product 5, which causes the ions of the gaseous plasma to accelerate towards the surface of the product 5 so as to perform the vacuum-plasma treatment, in particular, chemical heat treatment, of said surface.

The examples given below illustrate the advantages of the method disclosed herein and carried into effect by the device of FIG. 4.

There is carried out nitriding of the surface of the product 5, i.e., a tool provided with a film coating. Such a nitriding procedure is carried out through the aforesaid coating, because the best adhesion of titanium nitride layer to the tool base metal, i.e., high-speed tool steel is attained.

A lot of the products 5, that is, high-speed tool steel tips for cutting tools has been subjected to nitriding, the chemical composition of said high-speed tool steel being as follows (wt. %): W, 6.1; C, 0.8; Mo, 5.1, Cr, 4.0, Va, 1.8, Fe being the balance.

In the device of FIG. 4 the tips under treatment have preliminarily been coated with titanium nitride layer 4 μm thick, said coating being applied with the slats of louverboards of the means 13 open in order to admit metal ions generated by the integrally cold cathode 2 to pass freely to the surface of the product 5 under treatment. Then the slats of the louverboards of the means 13 are closed and one lot of the tips 20 in number is subjected to chemical heat treatment by being preheated at a positive potential and held in a preset temperature range by a combination of a positive and a floating potential applied thereto, the treatment parameters being as follows: working gas partial pressure, $8 \times 10^{-2}$ Pa; vacuum-arc discharge current, 120 A; voltage between the anodes 3, 22 and the cathode 2, 60 V; temperature of the tips under treatment, 500° C.; nitriding time, 40 min. The other lot of the tips also 20 in number is exposed to chemical heat treatment by being preheated at a positive potential and held in a preset temperature range by applying a negative potential to the tips under treatment, the treatment parameters being as follows: partial nitrogen pressure, $8 \times 10^{-2}$ Pa; vacuum-arc discharge current, 60 A; voltage between the cathode 2 and the anode 22, 60 V; temperature of the tips under treatment, 500° C.; negative voltage applied to the tips and supplied from the source 37, 800 V; nitriding time, 40 min. A visual inspection of the two lots of tips has found that the cutting edges of the tips of the second lot up to 2 mm which are devoid of the titanium nitride coating, which is due to concentration of the ion stream at the cutting edges that causes cathode sputtering of the titanium nitride layer. The tips thus treated have been tested by turning the steel having the following chemical composition (wt. %): C, 0.36; Si; 0.2; Mn 0.5; Cr, 1.1; Fe being the balance, with the following cutting speeds and feeds:

cutting speed—60 m/min, rate of feed—0.63 mm/rev, cutting depth—1 mm.

Average wear resistance (endurance) of the lot of tips that have been treated with a combination of a positive and a negative potential increases by 6.7 times compared to the initial one, whereas the wear resistance of the tips that have been treated with a negative potential, increases by 2.3 times.

The example cited above gives a clear-cut illustration of the fact that chemical heat treatment of products provided with a thin-film coating using the routine procedure involving the application of a negative potential to the product under treatment is unpractical.

In the device of FIG. 4 there has been performed hardening of the products 5, that is, drills 1.8 mm in diameter, under a floating potential applied thereto. A lot of drills 50 in number is used, the drills being clamped in the holding fixture 4 and subjected to nitriding with the following treatment parameters: partial nitrogen pressure, $6.5 \times 10^{-1}$ Pa; discharge current, 120 A; temperature of the product, 500° C.; time for preheating the drills to 480° C. under a floating potential, 12 min; time of holding at 480° C., 12 min.

The drills thus treated have been tested by drilling holes in steel of the following chemical composition (wt. %): C, 0.36; Si 0.2; Mn, 0.5; Cr, 1.1, Fe being the balance, under the following conditions:

drill spindle speed 8430 rpm, length of feed per drill spindle revolution—0.043 mm, drilling depth—4 mm.

An average increase in wear resistance: of the drills is 180%.

In the device of FIG. 5 the metal ions generated upon initiation of a vacuum-arc discharge between the cathode 2 and the anode 3 and propagated from the working area 12 of the cathode 2 along straight line paths, do not get into the compartment 18 of the interior space of the chamber 1.

In the device of FIG. 6 the ion stream of the metal-gaseous plasma does not go beyond the limits of a solid angle equal to 180° and having its vertex at the center of the cathode 2, whereby metal does not get onto the product 5 under treatment.

In the device of FIG. 7 vacuum-plasma treatment of products is carried out with the cathode 2 assuming the position shown with a dotted line in FIG. 7. With such a position of the cathode 2, the process of application of hardening coatings made from the material of the cathode can also be carried out adequately efficiently in the interior space of the chamber 1 bounded by a solid angle of 180°.

In the device of FIG. 8 the electric field inside the interior 46 of the hollow cylinder 44 is directed normally to the axis thereof due to the provision of the disk 50 having the center hole 51 and of the hollow cylinder 44 (serving as the anode 22) whose end 45 is directed towards the integrally cold cathode 2. The solenoid 49 encompassing the anode 22 generates an axially symmetrical magnetic field.

Thus, the electric and magnetic fields in the interior 46 of the hollow cylinder 44 are directed at right angles to each other.

It is common knowledge that the azimuthal electron Hall current arises in the gaseous plasma placed in a radial electric field and an axial magnetic field crossing each other. It is due to the appearance of the electric Hall current that the electron path is extended and its lifetime is prolonged whereby the ionizing capacity of electrons increases and hence the degree of gaseous plasma ionization is enhanced. Such an increase in the degree of plasma ionization gives rise to the following two important consequences:

increased activity of the gaseous plasma which in turn leads to intensification of the process of vacuum-plasma treatment; and higher proportion of electrical energy transferred from the vacuum-arc discharge to the gaseous plasma which in turn increases the heating capacity thereof utilizable when the product under treatment is preheated and held in a preset temperature range are carried out under a floating potential applied thereto.

In the device of FIG. 8 there have been performed two variants of nitriding the product 47 made from high-speed tool steel having the following chemical composition (wt. %): W, 6.1; C 0.8; Mo, 5.1; Cr, 4.0; Va, 1.8; Fe being the balance.

According to the first variant the product 47 is nitrided with the solenoid 49 deenergized, that is, the nitriding procedure differs in nothing from that effected in the device of FIGS. 1–7. The parameters of the nitriding process are as follows: partial nitrogen pressure, 133,×10–1 Pa; vacuum-arc discharge current, 60 A; current of solenoid 49 is such as to establish a voltage of 80 V between the cathode 2 and the anode 22; time for forming 15 μm thick nitrided layer, 12 min.

Thus, the presence of crossed electric and magnetic fields in the gas-discharge plasma in the device of FIG. 8 intensifies the vacuum-plasma treatment procedure.

The device of FIG. 9 is featured by all of the advantages possessed by the device of FIG. 8 and apart from this, it has extended processing capabilities of applying a wear-resistant coating to the surface of the product that has been subjected to vacuum-plasma treatment, in particular, chemical heat treatment. To this aim, the sputtering target 52 (the disk 54) is made from the metal of the wear-resistant coating to be applied. When a high-voltage negative potential is applied to the sputtering target 52, its sputtering surface 57 facing towards the gas-discharge plasma is subjected to ion bombardment and is thus sputtered. The sputtered material is deposited upon the product 47 to form a wear-resistant coating. When applying such a coating use is made of a gaseous mixture consisting of argon and nitrogen as the working gas.

Thus, the device of FIG. 9 can be used for carrying out a complex hardening process comprising chemical heat treatment followed by applying a hardening coating, which adds to a great extent to the wear-resistance of the product 47.

The device of FIG. 10 enables one to carry out and intensify the process of applying a coating to the product 47 that has been passed a vacuum-plasma treatment, in particular, chemical heat treatment, as well as to attain more uniform application of the coating as for thickness.

In this embodiment of the device a positive column of the vacuum arc discharge plasma runs along the internal surface of the cylinder 58. The cross-sectional area of said discharge is approximately the same throughout its pathway along the cylinder 58, which provides for constant density of the ion current on the cylinder 58 along its whole length and hence a homogeneous coating is ensured lengthwise the long-sized product 47 located in the interior space 63 of the cylinder 58.

The treatment process carried out in this embodiment of the device disclosed herein features the following parameters: argon pressure inside the chamber 1,5×10-2 Pa; discharge current, 100 A; voltage between the anode 22 and the cathode 2, 45 V; voltage on the target, 1000 V, current in the circuit of the target 52, 14 A.

The rate of application of the titanium coating to the product 47 spaced 50 mm apart from the target 52:

3.2 μm/h with the product 47 positioned in the lower portion of the target 52 as viewed in the direction of the election current of the plasma;

3.7 μm/h with the product 47 set in the central portion of the target 52;

3 μm/h with the product 47 situated in the upper portion of the target 52 as viewed in the direction of the electron current of the plasma.

Thus, the maximum coating inhomogeneity along the axis of the product 47 is 19%.

The device of FIGS. 11 and 12 is instrumental in carrying out and intensifying the process of coating application to the products 47 that have passed a vacuum-plasma treatment, in particular, chemical heat treatment, making it possible to enhance the quality of the coating being applied as for thickness thereof, which is due to assured ruling out of the onset of the drop phase during sputtering of the target 52. This is provided by the construction arrangement of the target 52 as shown in FIG. 12. Provision of the target 52 in the form of the arcuate plates 66 insulated from one another reduces the danger of arc discharges arising on its surface and hence excludes any possibility of appearing metal drops during sputtering of the target 52. Otherwise the operation of the device of FIGS. 11 and 12 is similar to that of the device of FIG. 10.

The device of FIG. 13 makes it possible to carry out and intensify the process of coating application to the products that have passed a vacuum-plasma treatment, in particular, chemical heat treatment, and to add to adhesive properties of the coatings being applied.

An accelerated beam from the source 67 is directed onto the surface of the product 5 under treatment in order to clean, activate, and preheat said surface. Said beam features highly homogeneous density of the flux of accelerated particles across its cross-sectional area, thus uniformly cleaning the surface of the product 5 and additionally heating it, which augments the quality of the coatings applied subsequently thereto.

In addition, there is provided cleaning and preheating of dielectric products with a beam of fast neutral molecules resultant from recharging of ions and/or with a beam of positive ions whose charge is neutralized on the surface of the dielectric product by the electrons from the vacuum-arc discharge plasma.

A broad range of diverse embodiments of the herein-disclosed method for treatment of products in gas-discharge plasma and carried into effect by the device, according to the invention, makes it possible to effect an intense vacuum-plasma treatment of products under large-scale industrial conditions, followed by application of hardening coatings within the range of reduced pressures ($10^{-2}$–10 Pa).

In the device disclosed herein and carrying into effect the method, according to the invention, the products under treatment are efficiently heated and their temperature is maintained in a preset range by applying a positive or a floating potential thereto. It is common knowledge that electron bombardment of the surface of the product under treatment does not affect the initial quality of surface finish; that is why the vacuum-plasma treatment under a positive potential involves no further technological procedures, such as grinding and polishing.

Possibility of carrying out an intense process of vacuum-plasma treatment under a floating potential without applying voltage to the product under treatment enables said process to be performed without temperature monitoring of the products under treatment, which is quite essential in treatment of small-size products, such as drills having a diameter under 3 mm, where the temperature measurement process is difficult to perform and, first and foremost, makes it possible to avoid annealing of sharp edges of the product due to an increased concentration of charged particles bombarding the surface of such edges upon applying a voltage to the products under treatment. Carrying out of the process of vacuum-plasma treatment under a positive potential makes it possible to rule out the danger of arc discharges arising on the surface of the products under treatment (that is, initiation of cathode spots on the products which in turn enables the process of vacuum-plasma treatment to he conducted at an optimum rate independent of the danger of initiation of the cathode spots on the surface of the product, said spots being causative of erosion of said surfaces. Thus, the time spent for carrying out the process of vacuum-plasma treatment is cut down, since there is no longer necessary to preheat the products under treatment gradually for fear of initiation of the cathode spots of vacuum-are discharge thereon.

It is noteworthy that unipolar arcs are likely to occur on the surface of the products under treatment under a floating potential applied thereto. However, the appearance of such arcs is much less probable than in case of a high-voltage negative potential. Endurance of cutting tools treated according to the disclosed method increases substantially, e.g., by 200–600% for tools used for turning hardly machinable steels, up to 1000% for drills, and up to 300% for hobs.

The device carrying the herein-disclosed method into effect features high reliability because the integrally cold cathode therein is heated to a temperature as low as 300°–400° C.

Moreover, the device carrying into effect the method disclosed herein is capable of producing gaseous plasma featuring a higher degree of ionization and hence more chemically active, whereby the time for formation of hardened surface layers is reduced.

The device carrying into effect the process disclosed herein is capable, apart from carrying out preheating, cleaning, and chemical heat treatment procedures, also of performing the processes of applying thin-film coatings, inasmuch as the integrally cold cathode of the vacuum-arc discharge intended for emission of electrons which initiate the gas-discharge plasma, can also serve as a source of an evaporable metal from which the thin-film coating is made. The processes are performed within the same pressure range of the working gas. As a result of an all-over treatment of, e.g., cutting tools their endurance increases by 150–300%.

INDUSTRIAL APPLICABILITY

The device for treatment of products in gas-discharge plasma carrying into effect the method for treatment of products in gas-discharge plasma, can find application in mechanical engineering for hardening the machine elements to increase their wear resistance, in the tool-making industry for hardening diverse cutting tools, such as turning tools, milling cutters, hobs, drills, broaches, die sets, as well as in chemical engineering for making equipment designed to operate in corrosive media.

We claim:

1. A method for treatment of products in a gas discharge plasma, comprising the steps of:
   initiating a vacuum arc discharge between an anode and a cold cathode, said discharge featuring a metal-gaseous plasma and a gaseous plasma, both of said plasmas being substantially isolated from each other by means that is substantially impermeable to metal ions and permeable to electrons;
   establishing the gaseous plasma of the vacuum arc discharge by ionizing a working gas with electrons separated from the metal-gaseous plasma of the vacuum arc discharge using said means impermeable to metal ions and permeable to electrons; and
   vacuum-plasma treatment of a product by preheating said product to a working temperature and by holding the product in a working temperature range in the medium of the working gas.

2. A method according to claim 1, wherein the step of vacuum-plasma treatment of the product by preheating and holding the product in a working temperature range is carried out in the gaseous plasma of the vacuum arc discharge.

3. A method according to claim 1, wherein the step of preheating of the product to working temperature is carried out by applying a positive potential to the product.

4. A method according to claim 1, wherein the product is held in a working temperature range by applying a positive potential to the product.

5. A method according to claim 1, wherein the product is additionally treated with a directional beam of accelerated particles.

6. A method according to claim 5, wherein a directional beam of neutral particles is used as the directional beam of accelerated particles.

7. A method according to claim 1, wherein after the product has been preheated and held in a working temperature range in the gaseous plasma, a coating is deposited onto the surface of the product in the metal-gaseous plasma.

8. A method according to claim 1, wherein after the product has been preheated and held in a working temperature range in the gaseous plasma, a coating is deposited onto the surface of the product in the gaseous plasma using gas ion sputtering of targets located in the gaseous plasma.

9. A device for treatment of products in a gas discharge plasma said discharge plasma comprising a metal gaseous plasma of metal ions, gas ions and electrons and a gaseous plasma of gas ions and electrons, comprising:
   a source of direct current electrically connected to a cold cathode and to an anode;
   both the cold cathode and the anode being enclosed in a vacuum chamber in a medium of a working gas at a reduced pressure; and
   a means substantially impermeable to metal ions and permeable to electrons for separating from the metal-gaseous plasma electrons establishing the gaseous plasma by ionizing the working gas.

10. A device according to claim 9, wherein the source of direct current is electrically connected to the anode, the cathode, and the chamber.

11. A device according to claim 10, wherein the vacuum chamber is used as an intermediate anode.

12. A device according to claim 9, wherein the products are used as the anode.

13. A device according to claim 9, wherein the means for separation of electrons is reciprocatingly movable with respect to the vacuum chamber.

14. A device according to claim 9, wherein the means for separation of electrons appears as a set of V-shaped plates facing with one of their side surfaces towards the cold cathode and with the other side surface towards the anode.

15. A device according to claim 9, wherein a wall of the vacuum chamber is used as the means for separation of electrons, said wall being situated in a zone of the cold cathode which is positioned so that its evaporative surface faces towards the wall.

16. A device according to claim 15, wherein the cold cathode is so positioned that its evaporation surface is angularly displaceable through 180° with respect to the wall of the vacuum chamber being used as the means for separation of electrons.

17. A device according to claim 9, wherein provision is therein made for a target connected to the negative pole of an individual source of direct current and interposed between the means for separation of electrons and the anode.

18. A device according to claim 17, wherein the target is made in the form of a hollow cylinder.

* * * * *

UNITED STATES PATENT AND TRADEMARK OFFICE
CERTIFICATE OF CORRECTION

PATENT NO. : 5,503,725
DATED : April 2, 1996
INVENTOR(S) : Sablev, Andreev, Grigoriev and Metel It is certified that error appears in the above-indentified patent and that said Letters Patent is hereby corrected as shown below:

```
On the cover page, Item 75, Line 3, please correct the spelling of
inventor's name from "Crigoriev" to --Grigoriev--.
```

Signed and Sealed this

Thirtieth Day of July, 1996

Attest:

BRUCE LEHMAN

*Attesting Officer*    Commissioner of Patents and Trademarks